United States Patent
Muehlbacher et al.

(10) Patent No.: US 12,452,587 B2
(45) Date of Patent: Oct. 21, 2025

(54) DIFFERENTIAL MEMS-READOUT CIRCUIT AND A METHOD OF USING THE SAME

(71) Applicant: Infineon Technologies AG, Neubiberg (DE)

(72) Inventors: Benno Muehlbacher, St. Magdalen (AT); Pedro Augusto Borrego Lambin Torres Amaral, Villach (AT); Mohammed Hassan, Villach (AT)

(73) Assignee: Infineon Technologies AG, Neubiberg (DE)

( * ) Notice: Subject to any disclaimer, the term of this patent is extended or adjusted under 35 U.S.C. 154(b) by 774 days.

(21) Appl. No.: 17/662,332

(22) Filed: May 6, 2022

(65) Prior Publication Data
US 2022/0417655 A1    Dec. 29, 2022

(30) Foreign Application Priority Data
Jun. 28, 2021  (EP) ................... 21182197

(51) Int. Cl.
  *H04R 3/00*  (2006.01)
  *H03F 3/45*  (2006.01)
  *H04R 19/04*  (2006.01)
(52) U.S. Cl.
  CPC .......... *H04R 3/00* (2013.01); *H03F 3/45475* (2013.01); *H04R 19/04* (2013.01); *H04R 2201/003* (2013.01); *H04R 2430/01* (2013.01)
(58) Field of Classification Search
  CPC ............ H03F 3/45475; H03F 2200/69; H03F 2203/45538; H04R 19/04; H04R 2201/003; H04R 3/00
  See application file for complete search history.

(56) References Cited

U.S. PATENT DOCUMENTS

| | | | |
|---|---|---|---|
| 11,418,890 B1* | 8/2022 | Nielsen | H04R 19/04 |
| 2011/0227652 A1* | 9/2011 | Froehlich | H03G 7/08 |
| | | | 330/260 |
| 2016/0111954 A1* | 4/2016 | Bach | H04R 19/04 |
| | | | 365/96 |
| 2017/0055056 A1* | 2/2017 | Rocca | H03F 3/183 |
| 2018/0332377 A1 | 11/2018 | Polo et al. | |
| 2020/0252729 A1* | 8/2020 | Mueller | H04R 29/004 |

OTHER PUBLICATIONS https://en.wikipedia.org/wiki/Electronic_symbol[Mar. 19, 2025 4:18:43 PM] (Year: 2025).*

* cited by examiner

Primary Examiner — Christopher E Mahoney
(74) Attorney, Agent, or Firm — Slater Matsil, LLP

(57) ABSTRACT

A differential MEMS-readout circuit comprises a first input bonding pad, including a first contact pin and a second contact pin. The differential MEMS-readout circuit comprises a second input bonding pad, including a first contact pin and a second contact pin; and a differential-readout amplifier section comprising a first input connected to the first contact pin of the first input bonding pad and a second input connected to the first contact pin of the second bonding pad, wherein the differential-readout amplifier section comprises a first and a second transistor circuit and each of the second contact pins of the first and second input bonding pads is coupled to one of the first and the second transistor circuits or is coupled to one of the first and the second transistor circuits and/or to ground.

28 Claims, 24 Drawing Sheets

DIFFERENTIAL MEMS-READOUT CIRCUIT AND A METHOD OF USING THE SAME

This application claims the benefit of European Patent Application No. 21182197, filed on Jun. 28, 2021, which application is hereby incorporated herein by reference.

TECHNICAL FIELD

The disclosure relates in general to a differential MEMS-readout circuit, a MEMS-device for connection to a MEMS-readout circuit and to a system comprising the MEMS-readout circuit and the MEMS device. The disclosure especially refers to a method of using a MEMS-readout circuit.

BACKGROUND

Capacitive MEMS microphones use a source follower based readout amplifier, as this is the optimum choice for such an application in order to optimize the signal to noise ratio (SNR), the total harmonic distortion (THD), the consumption, the area, etc. The MEMS (micro-electro-mechanical system) used is of differential type and therefor generates a positive and a negative signal which gets buffered and or amplified by the readout circuit. It can happen that the MEMS generated signals have a different amplitude up to several decibel. This results in a lower acoustic overload point since the larger signal will define the clipping of the signal. Such a clipping should be avoided.

One straightforward solution would be to make the MEMS more symmetric or sort out devices with too high asymmetry. But this of course causes a not wanted yield issue. Another obvious solution is to use a gain amplifier with e.g. different gain resistors for positive or negative output. This solution suffers from a not optimum SNR, since the gain resistors contribute to the noise budget or their values have to be that small that they cause a high dynamic current when signal is applied.

Generally, there is a need in the art for an approach to implement an improved differential MEMS-readout circuit and an improved system comprising a MEMS-device coupled to the proposed MEMS-readout circuit and a method of using a MEMS-readout circuit, so that a higher acoustic overload point results.

Such a need can be solved for the subject-matter of the independent claims. Further specific implementations of the present concept (method and apparatus) for providing an improved differential MEMS-readout circuit is subject of the dependent claims. A MEMS-device for connection to a MEMS-readout circuit and to a system comprising the MEMS-readout circuit and the MEMS device and a method of using a MEMS-readout circuit are also disclosed.

SUMMARY

In an embodiment, a differential MEMS-readout circuit comprises a first input bonding pad, which represents a first capacitance C1; wherein the first capacitance comprises the first input bonding pad as a first contact pin and a second contact pin. The differential MEMS-readout circuit comprises further a second input bonding pad, which represents a second capacitance C2; wherein the second capacitance comprises the second input bonding pad as a first contact pin and a second contact pin.

Furthermore, the differential MEMS-readout circuit comprises a differential-readout amplifier section that comprises a first input connected to the first contact pin of the first input bonding pad and a second input connected to the first contact pin of the second bonding pad. The differential-readout amplifier section comprises a first and a second transistor circuit and each of the second contact pins of the first and second input bonding pads is coupled to one of the first and the second transistor circuits or is coupled to one of the first and the second transistor circuits and/or to ground (Gnd). Each of the first and second transistor circuits comprises a source follower. This in turn means, that the differential-readout amplifier section comprises two source followers that are coupled with one another.

The proposed differential MEMS-readout circuit makes use of the always available input bonding pads, which represents capacitances. One input (i.e., the first contact pin) of each capacitance is connected to the MEMS output, and the second contact pin of each capacitance is connected either to a positive or a negative output of the used readout circuit. The connection between the second contact pins of each capacitance and the outputs could be done with metal wires or with switches.

By using switches either the positive or negative output can be chosen. If the capacitance at the positive MEMS output is connected to the positive readout output the capacitance acts, as it is not present since the first and the second contact pins of the corresponding capacitance are in phase. If the capacitance is connected to the negative (ASIC) output it can act as attenuator of the input signal. With this method it is possible to achieve a gain symmetry of up to 1 to 2 dB (depending on the capacitance value), resulting in a better THD of high sound pressure signals also of plus 1 to 2 dB.

According to an example, a MEMS-device for connection to a MEMS-readout circuit is disclosed wherein the MEMS device is configured to act as a differential type sensor to provide at the first contact pins differential signals, wherein the MEMS-readout circuit is configured to receive the differential signals and to reduce a difference in the amplitude of the differential signals at the second outputs. For connection with the MEMS-device a MEMS-readout circuit as proposed is used. The proposed MEMS-device connected to the proposed MEMS-readout circuit form a proposed system. Such a system may be implemented by a MEMS-microphone. The System, in particular such a MEMS-microphone or the like, have a higher acoustic overload, which is measured at the customer.

According to an example, a method of using a proposed MEMS-readout circuit is disclosed. The method comprises providing a MEMS-device and connecting the MEMS-device with the MEMS-readout circuit. The method comprises connecting a first input to the first contact pin of the first input bonding pad and connecting a second input to the first contact pin of the second bonding pad, and coupling each of the second contact pins of the first and second input bonding pads to one of the first and the second transistor circuits or to one of the first and the second transistor circuits and/or to ground.

In particular, if the amplitudes of the signals of the MEMS-device do not differ essentially from each other, the method comprises connecting the first, in particular positive, contact pin INP of the first capacitance C1 to the positive output of the MEMS-device and the second contact pin of the first capacitance to the first, in particular positive, output of the first transistor circuit of the readout amplifier section, so that the first capacitance acts as it is not present, because the first and second contact pins of the first capacitance C1 are switched in phase, or connecting the first, in particular positive, contact pin INP of the first capacitance C1 to the positive output of the MEMS-device and the second contact pin of the first capacitance to the first, in particular negative, output of the second transistor circuit of the readout amplifier section or to ground, so that the first capacitance C1 acts as attenuator of the input signal in order to reduce a difference between the differential output signals.

Accordingly the method may comprise connecting the first, in particular positive, contact pin of the second capacitance C2 to the negative output of the MEMS-device and the second contact pin of the second capacitance C2 to the first, in particular negative, output of the second transistor circuit of the readout amplifier section, so that the second capacitance C2 acts as it is not present, because the first and second contact pins of the second capacitance C2 are switched in phase, or connecting the first, in particular positive, contact pin of the second capacitance C2 to the positive output of the MEMS-device and the second contact pin of the second capacitance C2 to the first, in particular positive, output of the first transistor circuit of the readout amplifier section or to ground, so that the second capacitance C2 acts as attenuator of the input signal in order to reduce a difference between the differential output signals.

In particular, if the amplitudes of the signals of the MEMS-device differ essentially from each other, the method may comprise connecting the first contact pin of the first capacitance to the positive output of a MEMS-device and connecting the second contact pin of the first capacitance to the first output or to the second output of the first transistor circuit of the readout amplifier section, and connecting the first contact pin of the second capacitance to the negative output of a MEMS-device and connecting the second contact pin of the second capacitance to the first output or to the second output of the first transistor circuit of the readout amplifier section, a difference between amplitudes of signals at the first contact pins of the first and second capacitances is compensated.

Alternatively, the method may comprise connecting the first contact pin of the first capacitance to the positive output of a MEMS-device and connecting the second contact pin of the first capacitance to the first output or to the second output of the second transistor circuit of the readout amplifier section, and connecting the first contact pin of the second capacitance to the negative output of a MEMS-device and connecting the second contact pin of the second capacitance to the first output or to the second output of the second transistor circuit of the readout amplifier section, a difference between amplitudes of signals at the first contact pins of the first and second capacitances is compensated.

The latter two options allow for compensating a difference of the amplitudes of the signals of the MEMS-device.

The core of the invention is to use the bonding pad capacitance to correct a possible amplitude asymmetry of the MEMS. The correction can be done in positive or negative direction.

BRIEF DESCRIPTION OF THE DRAWINGS

Embodiments of the present device for providing a differential MEMS-readout circuit, and providing a MEMS-device coupled to the differential MEMS-readout circuit, and a method of using a MEMS-readout circuit are described herein making reference to the appended drawings and figures.

DETAILED DESCRIPTION OF ILLUSTRATIVE EMBODIMENTS

Before discussing the present embodiments in further detail using the drawings, it is pointed out that in the figures and the specification identical elements and elements having the same functionality and/or the same technical or physical effect are usually provided with the same reference numbers or are identified with the same name, so that the description of these elements and of the functionality thereof as illustrated in the different embodiments are mutually exchangeable or may be applied to one another in the different embodiments. In FIGS. 1-10 the symbols labeled "DC" are to be understood as DC current sources.

In the following description, embodiments and examples are discussed in detail, however, it should be appreciated that the embodiments and examples provide many applicable concepts that can be embodied in a wide variety of MEMS devices. The specific embodiments and examples discussed are merely illustrative of specific ways to make and use the present concept, and do not limit the scope of the embodiments. In the following description of embodiments and examples, the same or similar elements having the same function have associated therewith the same reference signs or the same name, and a description of the such elements will not be repeated for every embodiment. Moreover, features of the different embodiments described hereinafter may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

It is further understood that an output OutP may also be abbreviated by outp or outP, or OutP. The same abbreviation apply to all the other output and inputs in an analogous fashion, i.e. it does not matter if capital letters or small letter are used.

Simulation results as for example shown in FIGS. 11-15, 17, and 20-23 are shown on the y-axis in a logarithmic scale [dB] against different settings.

Figure 1A:
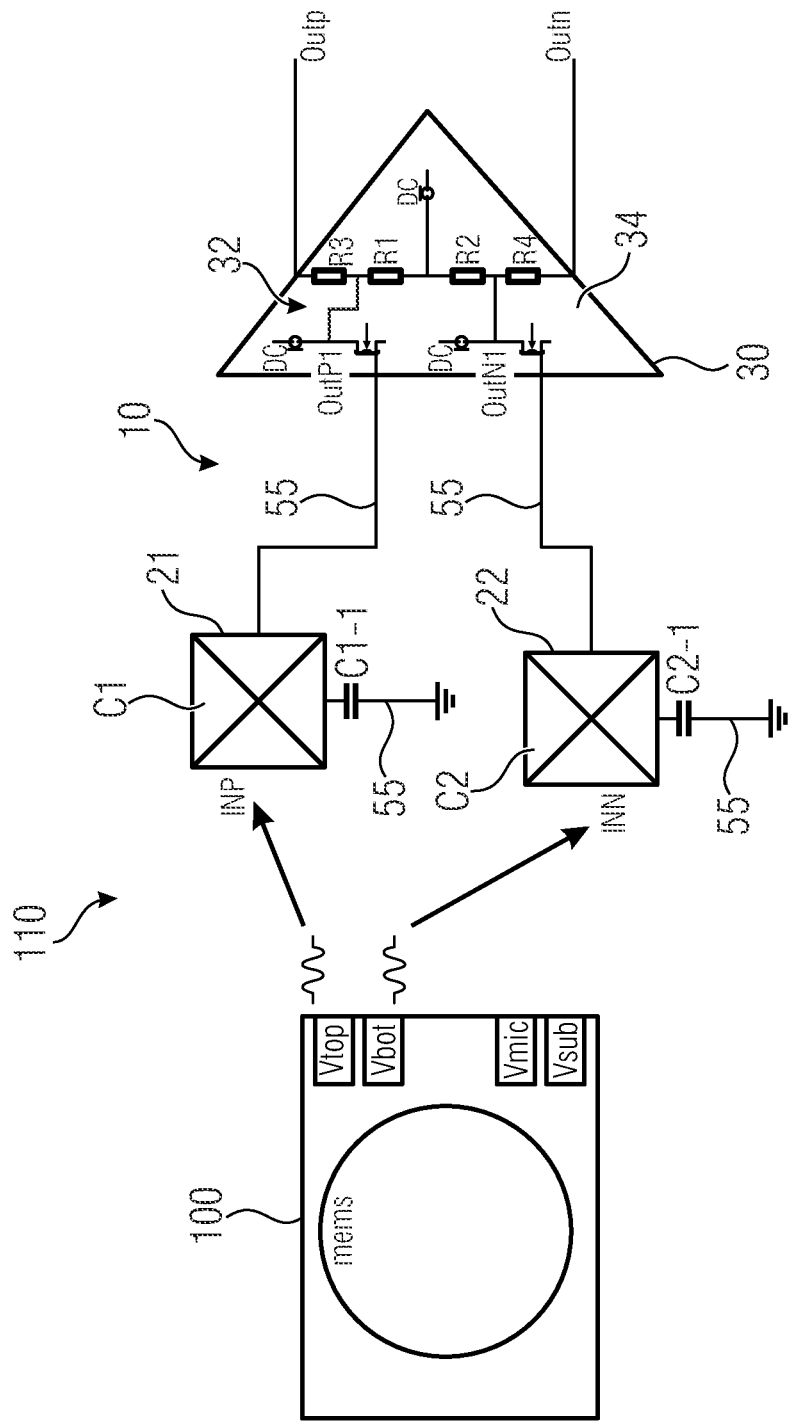
FIGS. 1a, 1b show a schematic of a default input configuration of a differential MEMS-readout circuit, wherein the differential MEMS-readout circuit is coupled to a MEMS-device (FIG. 1a), and different signals outputted by a MEMS-device; the signals having different amplitudes (FIG. 1b)
Figure 1B:
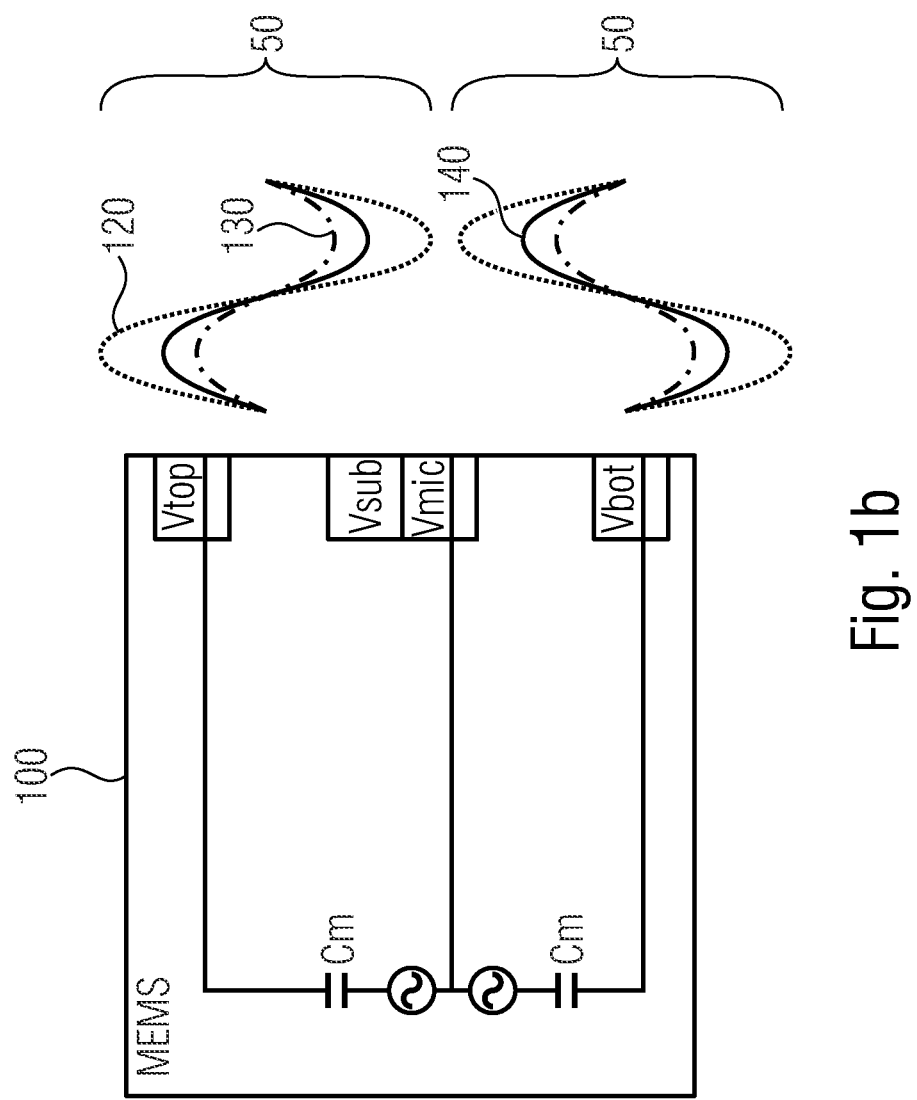

FIG. 1*a* shows a schematic of a default input configuration of a differential MEMS-readout circuit 10, wherein the differential MEMS-readout circuit 10 is coupled to a MEMS-device 100. The MEMS-device 100 and the MEMS-readout circuit 10 together form a system no. FIG. 1*b* shows, for example, different signals 50 outputted by a MEMS-device 100; the signals 50 having different amplitudes 120, 130, 140. For example, if the MEMS-device 100 provide at inputs INP, INN signals 50 having a similar amplitude 140 with respect to its absolute maximal and/or minimal values (and not with respect to its actual phase), it is not necessary to compensate the difference of the signals 50. In this case one of the configurations called settings a, a', d or d' shown in the FIGS. 3 to 6 may be used. FIGS. 2 to 10 show in each case a schematic of a differential MEMS-readout circuit 10, wherein the coupling to a MEMS-device 10 is indicated by input the signals 50. In all FIGS. 1 to 10 the differential MEMS-readout circuit 10 comprises a first input bonding pad 21, which represents a first capacitance C1, wherein the first capacitance C1 comprises the first input bonding pad 21 as a first contact pin INP and a second contact pin C1-1.

The differential MEMS-readout circuit 10 comprises furthermore a second input bonding pad 22, which represents a second capacitance C2. The second capacitance C2 comprises the second input bonding pad 22 as a first contact pin (INN) and a second contact pin C2-1. Furthermore, the differential MEMS-readout circuit 10 comprises a differential-readout amplifier section 30 comprising a first input INP1 connected to the first contact pin INP of the first input bonding pad 21 and a second input INN1 connected to the first contact pin INN of the second bonding pad 22. The differential-readout amplifier section 30 comprises a first and a second transistor circuit 32, 34. Each of the first transistor circuit 32 and the second transistor circuit 34 functions as a source follower. This means the differential-readout amplifier section 30 comprises two source followers. The first transistor circuit 32 and the second transistor circuit 34 are coupled with one another in the differential-readout amplifier section 30. This implementation of the differential MEMS-readout circuit 10 is common in all of the differential MEMS-readout circuits 10 shown in the FIGS. 1 to 10. FIGS. 7 to 10, for example, show configurations of settings b, b', c or c', that may be used, if the signals 50 provided by the MEMS-device 100 at the first contact pins INP, INN have a different amplitude 120, 130 with respect to its absolute maximal and/or minimal values. The configurations shown in FIG. 7 to 10, i.e. settings b, b', c or c', may be used for compensating a difference in the amplitudes. This will be explained in more detail with respect to the FIGS. 11 to 19.

As shown in the FIGS. 1 to 10 each of the second contact pins C1-1, C2-1 of the first and second input bonding pads 21, 22 is coupled to one of the first and the second transistor circuits 32,34 or is coupled to one of the first and the second transistor circuits 32, 34 and/or to ground Gnd.

Figure 2:
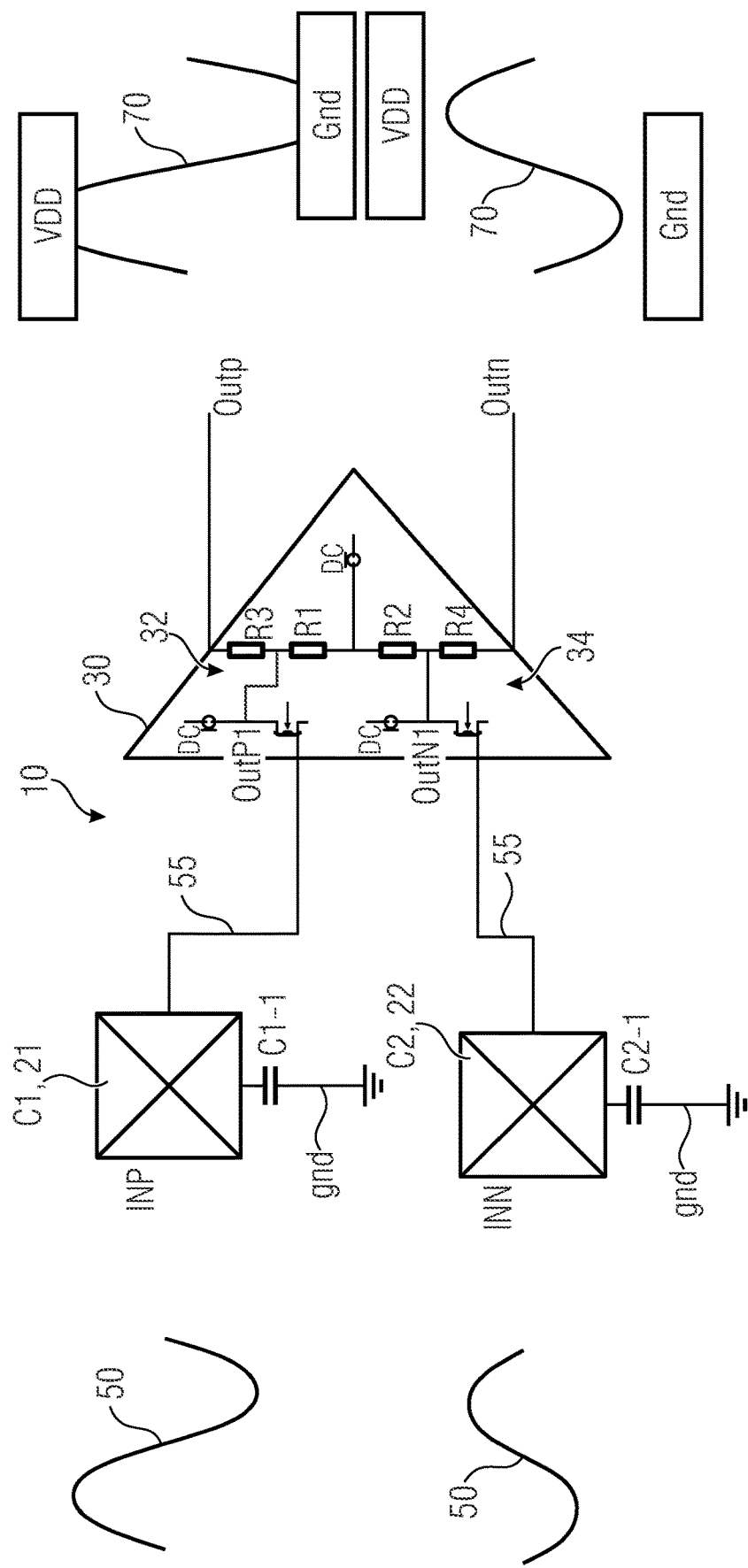
FIG. 2 shows a schematic of a differential MEMS-readout circuit.

For example, FIGS. 1*a* and 2 show that each of the second contact pins C1-1, C2-1 of the first and second input bonding pads 21, 22 is coupled to ground Gnd. In the configuration as shown in FIGS. 1*a* and 2 the first and second capacitance C1, C2 attenuate the input signal 50 (or in short signal(INP) or signal(INN) respectively). The signals at the first outputs is given by $$\text{Signal}(OutP_1) = \text{signal}(INP) * \frac{Cm}{(Cm + C1)}; \text{and}$$

$$\text{Signal}(OutN_1) = \text{signal}(INN) * \frac{Cm}{(Cm + C2)}.$$

The capacitance Cm is the corresponding capacitance of the used Mems-device 100, in particular defined by the area of the Mems, and a distance of the read out plates.

At the second output (OutN, OutP) the signal is amplified according to an amplification factor A. This means signal(outn)=$A$*signal(OutN1); and signal(outp)=$A$*signal(OutP1)

is valid. The amplification factor A may be equal to 1 or may be greater.

The option that one of the second contact pins C1-1, C2-1 of the first and second input bonding pads 21, 22 is coupled to one of the first and the second transistor circuits 32, 34 and/or one of the second contact pins C1-1, C2-1 is coupled to ground Gnd is not shown in the FIGS. 1 to 10. A basic idea of the concepts described herein is to compensate different amplitudes provided by the MEMS-device 100. The most effective is to attenuate the too large signal 50, in particular, if the signal 50 at input INP, for example, gets too large signal, put the first capacitance C1 to one of the outputs outn1/outn, and amplify the too small signals 50, in particular, if the signal 50 at input INN, for example, gets too large signal, put the second capacitance C2 to outp1/outp. Such configurations are for example shown in FIGS. 7 to 10. If the amplitude difference is in a smaller range, a connection to Gnd could be also sufficient, in particular in the example above the first capacitance C1 may be connected to Gnd, while the second capacitance may be connected with the output outN1 or outN (not shown).

As shown in FIGS. 3 to 10 each of the first and second transistor circuit 32, 34 comprises a first output OutP1, OutN1 and a second output Outp, Outn. The second contact pins C1-1, C2-1 are impinged with one of the signals from the first output OutP1, OutN1 and/or second output Outp, Outn and/or ground Gnd.

Figure 3:
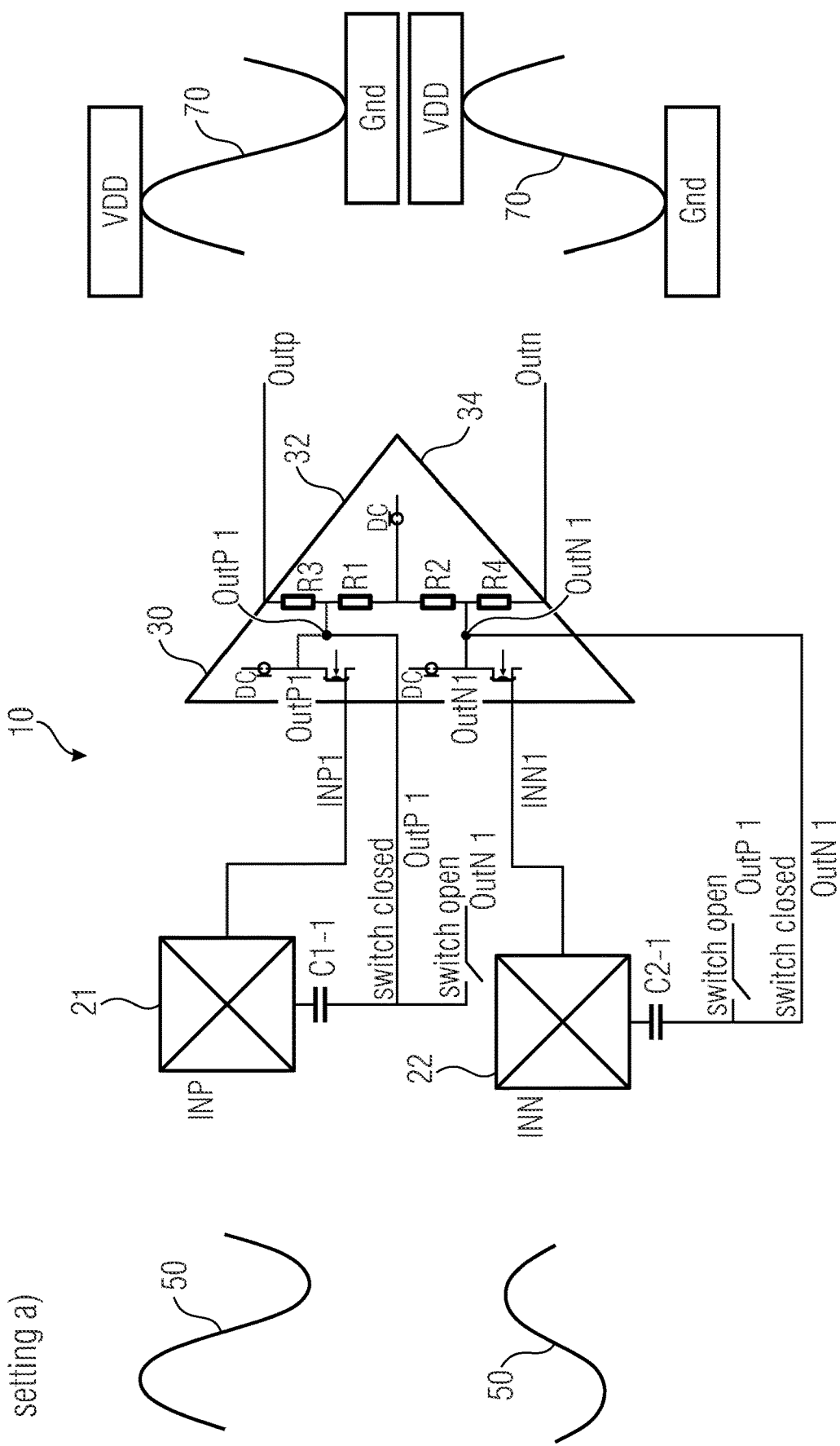
FIG. 3 shows a schematic of a differential MEMS-readout circuit.
Figure 4:
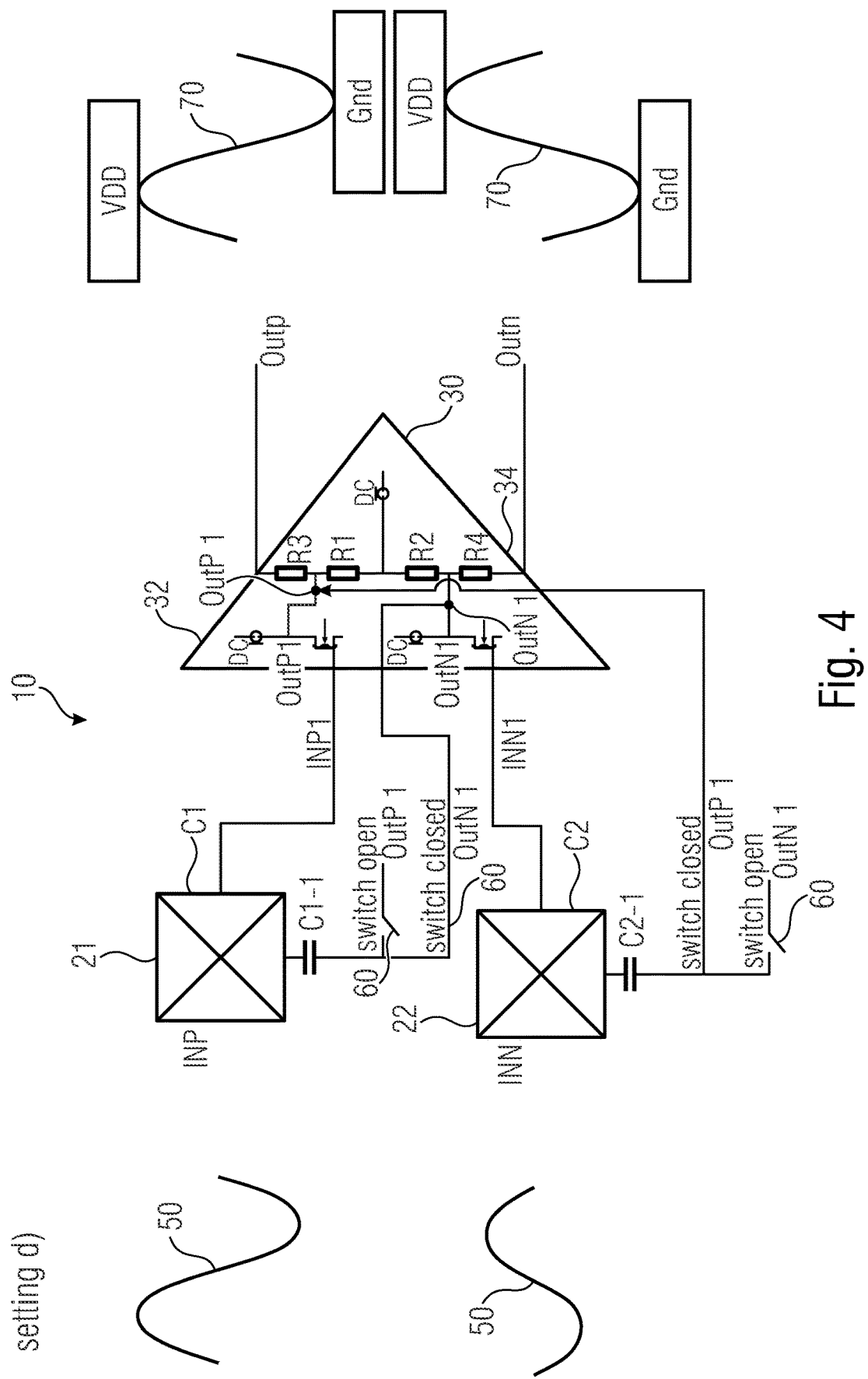
FIG. 4 shows a schematic of a differential MEMS-readout circuit.

The first output OutP1, OutN1 of each of the first and second transistor circuits 32, 34 is an intermediate output of the differential-readout amplifier section 30. In particular, the first output OutP1, OutN1 of each of the first and second transistor circuits 32, 34 provides a buffered input signal. This means, the input signal 50 is stabilized by the source followers. The input signal is buffered, but not amplified. FIGS. 3 and 4 show a switching of the differential MEMS-readout circuit 10 providing a buffered, but not amplified input signal 50 at the first intermediate outputs OutP1, OutN1.

As shown in FIG. 3, the second contact pins C1-1 of the first capacitance C1 of the first input bonding pad 21 is coupled to the first output OutP1 of the first transistor circuit 32. Further, the second contact pin C2-1 of the second capacitance C2 of the second input bonding pad 22 is coupled to the first output OutN1 of the second transistor circuit 34. In the configuration as shown in FIG. 3, that corresponds to a setting a, the first and second capacitance C1, C2 act as they were not present, because the first and the second capacitance C1, C2 are switched in phase. The signals at the first inputs InP1, InN1 (in short signal (InP1)/signal (InN1)) correspond to the signals at the first outputs OutP1, OutN1, in particular signal(InP1)=signal(OutP1) and signal (InN1)=signal (outN1) is valid. At the second output (OutN, OutP) the signal is amplified according to an amplification factor A. This means signal(outn)=A*signal(OutN1) and signal(outp)=A*signal(OutP1) is valid. The amplification factor A may be equal to 1 or may be greater.

As shown in FIG. 4, the second contact pins C1-1 of the first capacitance C1 of the first input bonding pad 21 is coupled to the first output OutN1 of the second transistor circuit 34. Further, the second contact pin C2-1 of the second capacitance C2 of the second input bonding pad 22 is coupled to the first output OutP1 of the first transistor circuit 32. In the configuration as shown in FIG. 4, that corresponds to a setting d, the first and second capacitance C1, C2 attenuate the input signal 50, because the first and the second capacitance C1, C2 are no longer switched in phase. This behavior is similar to the resulting behavior of the configurations as shown in FIGS. 1 and 2. The signal at the first outputs is given by $$\text{Signal}(OutP_1) = \text{signal}(INP) * \frac{Cm}{(Cm + C1)}; \text{ and}$$

$$\text{Signal}(OutN_1) = \text{signal}(INN) * \frac{Cm}{(Cm + C2)}.$$

The capacitance Cm is the corresponding capacitance of the used MEMS-device 100, in particular defined by the area of the MEMS, and the distance of the read out plates.

At the second output (OutN, OutP) the signal is amplified according to an amplification factor A. This means signal (outn)=A*signal(OutN1) and signal(outp)=A*signal (OutP1) is valid. The amplification factor A may be equal to 1 or may be greater.

As shown in the FIGS. 1 to 10 the second output OutP, OutN of each of the first and second transistor circuits 32, 34 is an external output of the differential-readout amplifier section 30. In particular, the second output OutP, OutN of each of the first and second transistor circuits 32, 34 is amplified in an arbitrary ratio of amplification A. The ratio of amplification A or the amplification factor A is setting dependent. For example, the amplification factor A may be dependent on resistances R1, R2, R3, R4. The resistances R1, R2, R3, R4 may be used in the first and second transistor circuits 32, 34.

Figure 5:
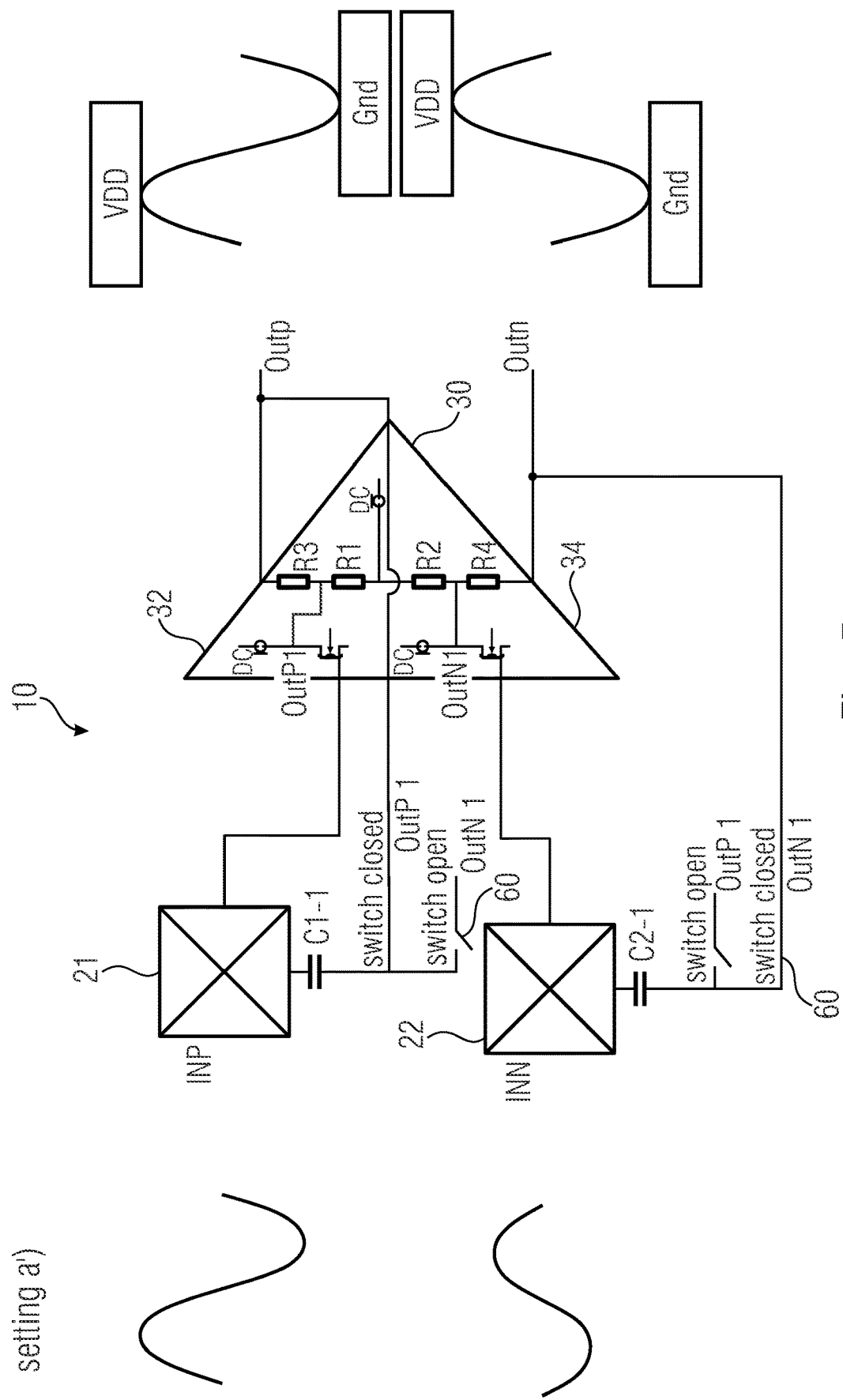
FIG. 5 shows a schematic of a differential MEMS-readout circuit.

As shown in FIG. 5, the second contact pins C1-1 of the first capacitance C1 of the first input bonding pad 21 is coupled to the second output OutP of the first transistor circuit 32. Further the second contact pin C2-1 of the second capacitance C2 of the second input bonding pad 22 is coupled to the second output OutN of the second transistor circuit 34. In the configuration as shown in FIG. 5, that corresponds to a setting a' (compare with FIG. 3), the signal at the second output (OutN, OutP) is amplified according to an amplification factor A. This means signal(outn)=A*signal (OutN1) and signal(outp)=A*signal(OutP1) is valid. The amplification factor A may be equal to 1 or may be greater. Again, the first and second capacitance C1, C2 act as they were not present, because the first and the second capacitance C1, C2 are switched in phase. The settings a (FIG. 3) and a' (FIG. 5) are of similar connection resulting both in an in-phase switching of the capacitances C1, C2. The settings a and a' respectively each provide a positive connection, which may be represented in short by {INP–OutP, and INN–OutN} or by {INP–OutP1, and INN–OutN1} (see FIGS. 3 and 5).

Figure 6:
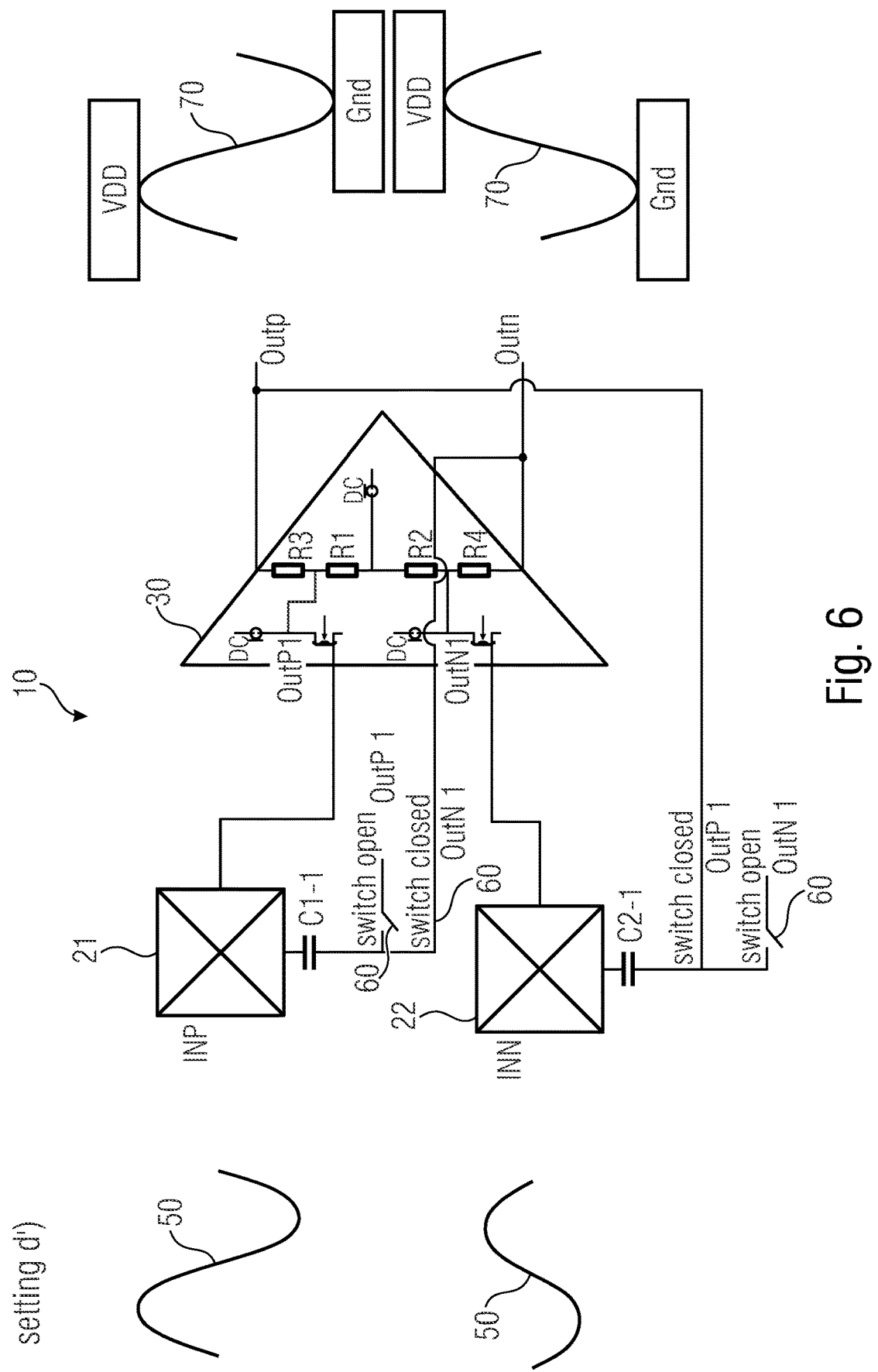
FIG. 6 shows a schematic of a differential MEMS-readout circuit.

As shown in FIG. 6, the second contact pins C1-1 of the first capacitance C1 of the first input bonding pad 21 is coupled to the second output OutN of the second transistor circuit 34. Further the second contact pin C2-1 of the second capacitance C2 of the second input bonding pad 22 is coupled to the second output OutP of the first transistor circuit 32. In the configuration as shown in FIG. 6, that corresponds to a setting d' (compare with FIG. 4), the first and second capacitance C1, C2 attenuate the input signal 50, because the first and the second capacitance C1, C2 are no longer switched in phase. According to the settings d and d', the first and the second capacitance C1, C2 act as twice implemented (2*A). At the second output (OutN, OutP) the signal is amplified according to an amplification factor A. This means signal(outn)=A*signal(OutN1) and signal(outp)=A*signal(OutP1) is valid. The amplification factor A may be equal to 1 or may be greater. The settings d and d' respectively each provide a negative connection, which may be represented in short by {INP–OutN, and INN–OutP} or by {INP–OutN1, and INN–OutP1} (see FIGS. 3 and 5). The negative connection may also be considered a cross connection or an out-of-phase connection. A cross connection because one contact pin of one capacitance is coupled with the first transistor circuit 32 and the other contact pin of the same capacitance is coupled with the second transistor circuit 34. Said connection effects that the first and the second capacitance C1, C2 act as twice implemented (2*A). Therefore, the negative connection may be considered as out-of-phase connection.

The examples according to the setting a, a', d, d' described above are affecting both second outputs OutP, OutN in the same direction. A possible asymmetry of the signals 50 arising at the contact pins INP and INN from a connection between the MEMS-device 100 and the MEMS-readout circuit 10 may be handled as described with respect to the FIGS. 7 to 10 next. The handling of an asymmetry of the signals 50 describe an important part of the technical concept described herein. The technical concept described herein allows for using the differential MEMS-readout circuit 10, when coupled to a MEMS-device, no matter what kind of signals 50 occur at the contact pins INN, INP.

Figure 7:
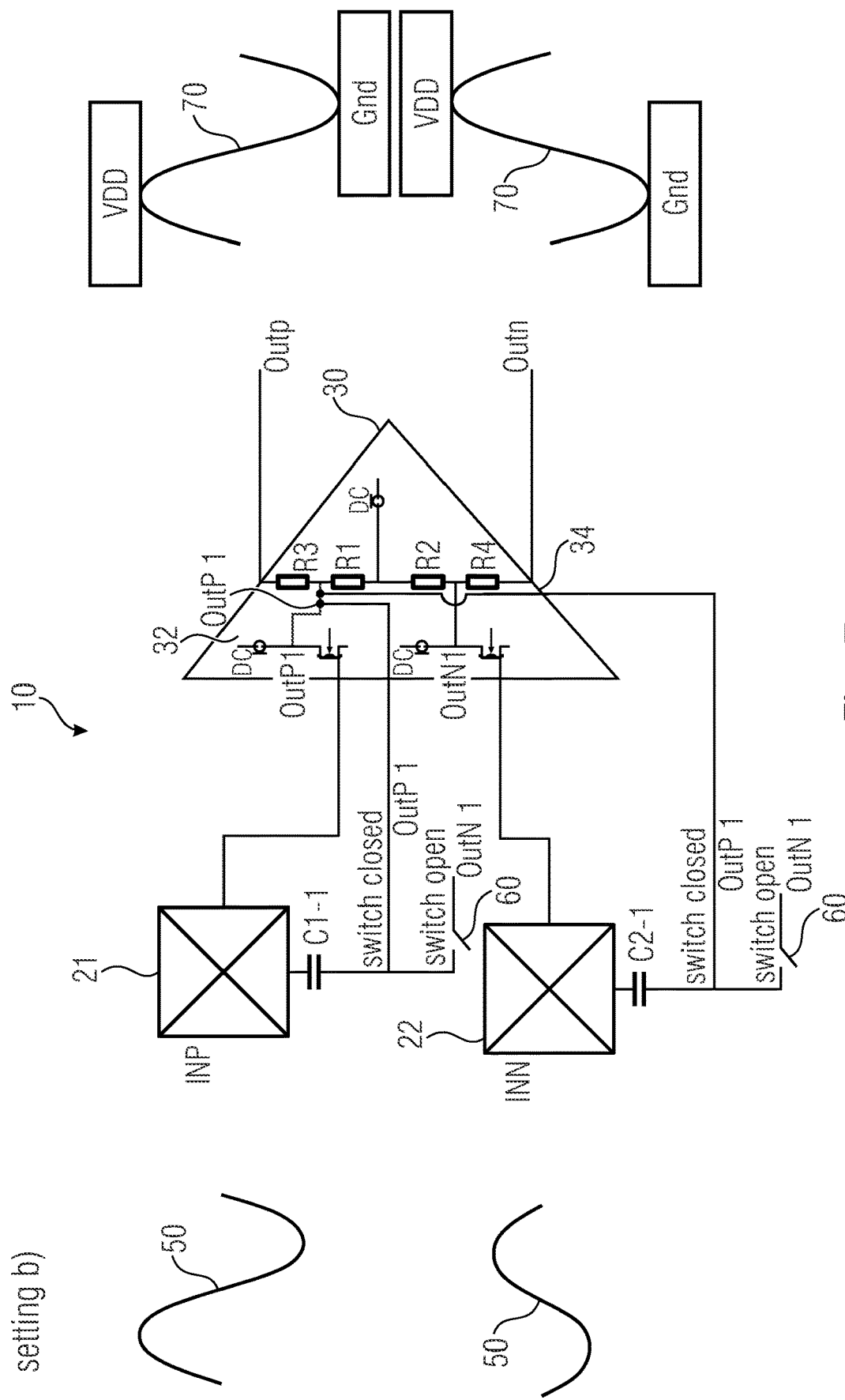
FIG. 7 shows a schematic of a differential MEMS-readout circuit.
Figure 8:
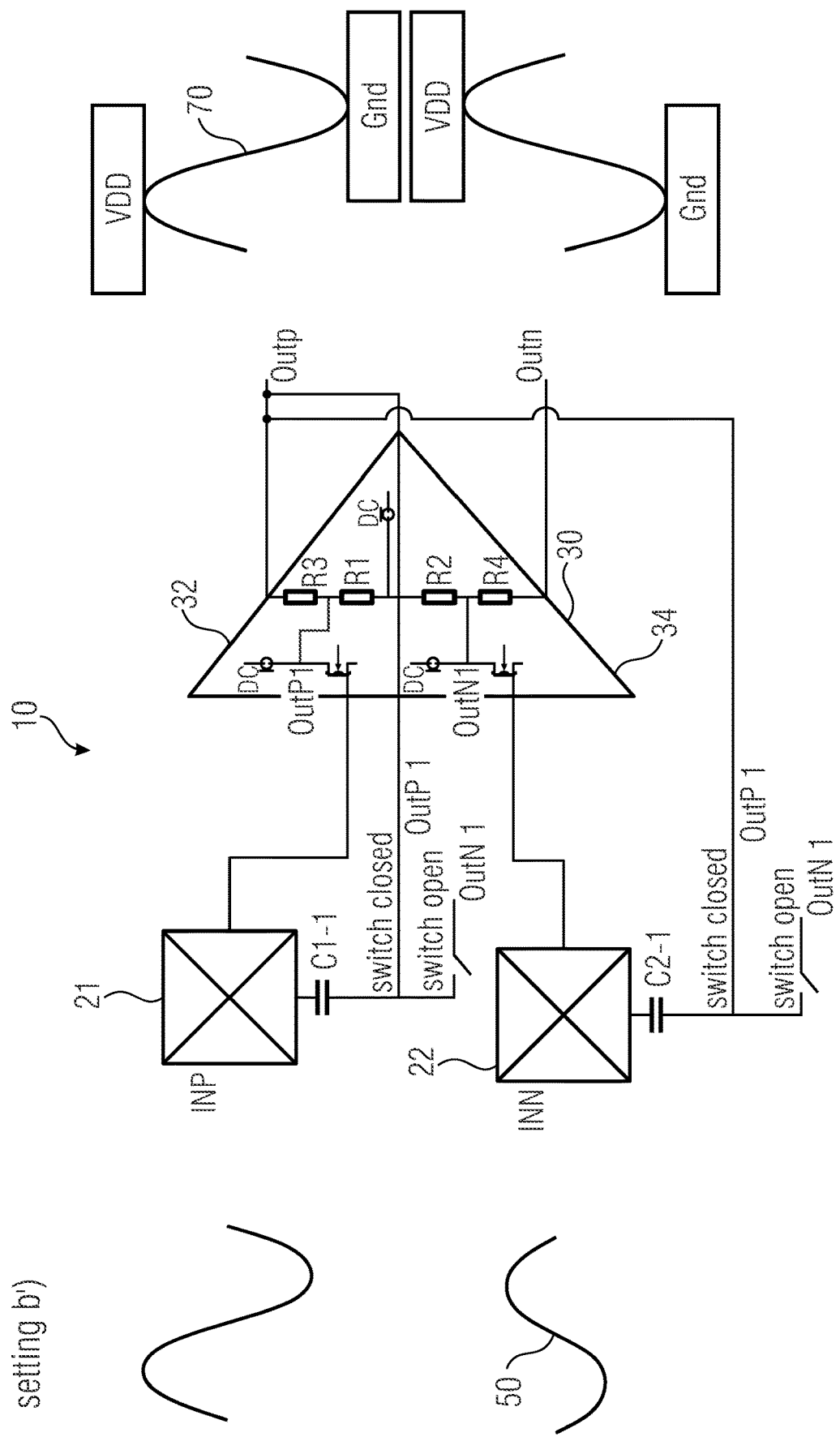
FIG. 8 shows a schematic of a differential MEMS-readout circuit.

FIGS. 7 and 8 are described together, since FIGS. 7 and 8 show similar settings b and b'.

For example, if the input signal 50 at INN is larger compared to the input signal 50 at INP (see for example, reference signs 120, 130 in FIG. 1b or FIGS. 7 and 8), than the second contact pin C2-1 of the second capacitance C2 is connected to first output Outp1 or the second output Outp of the first transistor circuit 32. In this case, the second capacitance C2 acts as two times present. The second contact pin C1-1 of the first capacitance C1 is also connected to the first output Outp1 or the second output OutP of the first transistor circuit 32. The first capacitance C1 is acting as it was not present, since the first and second contact pins INP, C1-1 of the first capacitance C1 are impinged with the same in phase signal.

Figure 9:
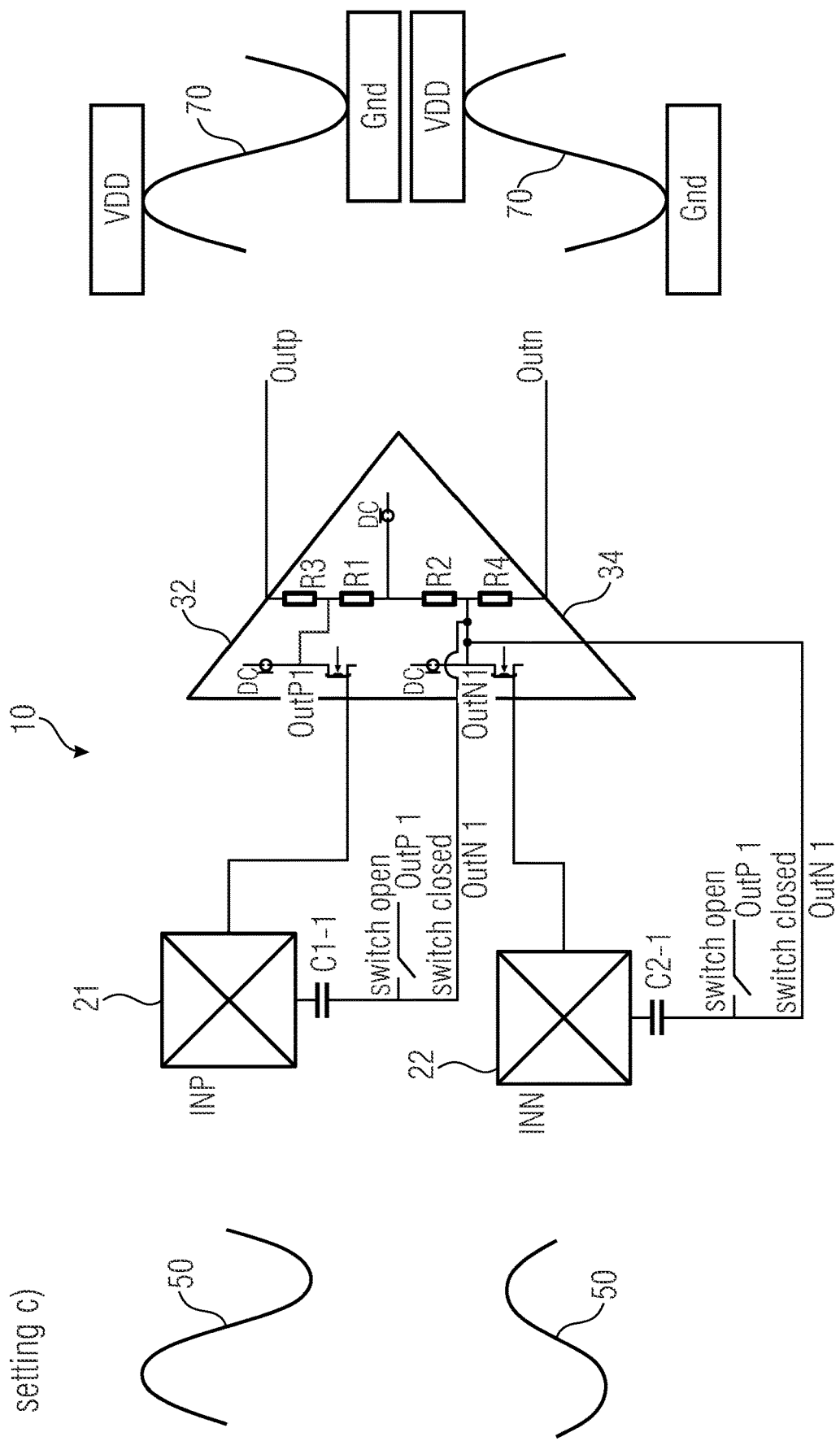
FIG. 9 shows a schematic of a differential MEMS-readout circuit.
Figure 10:
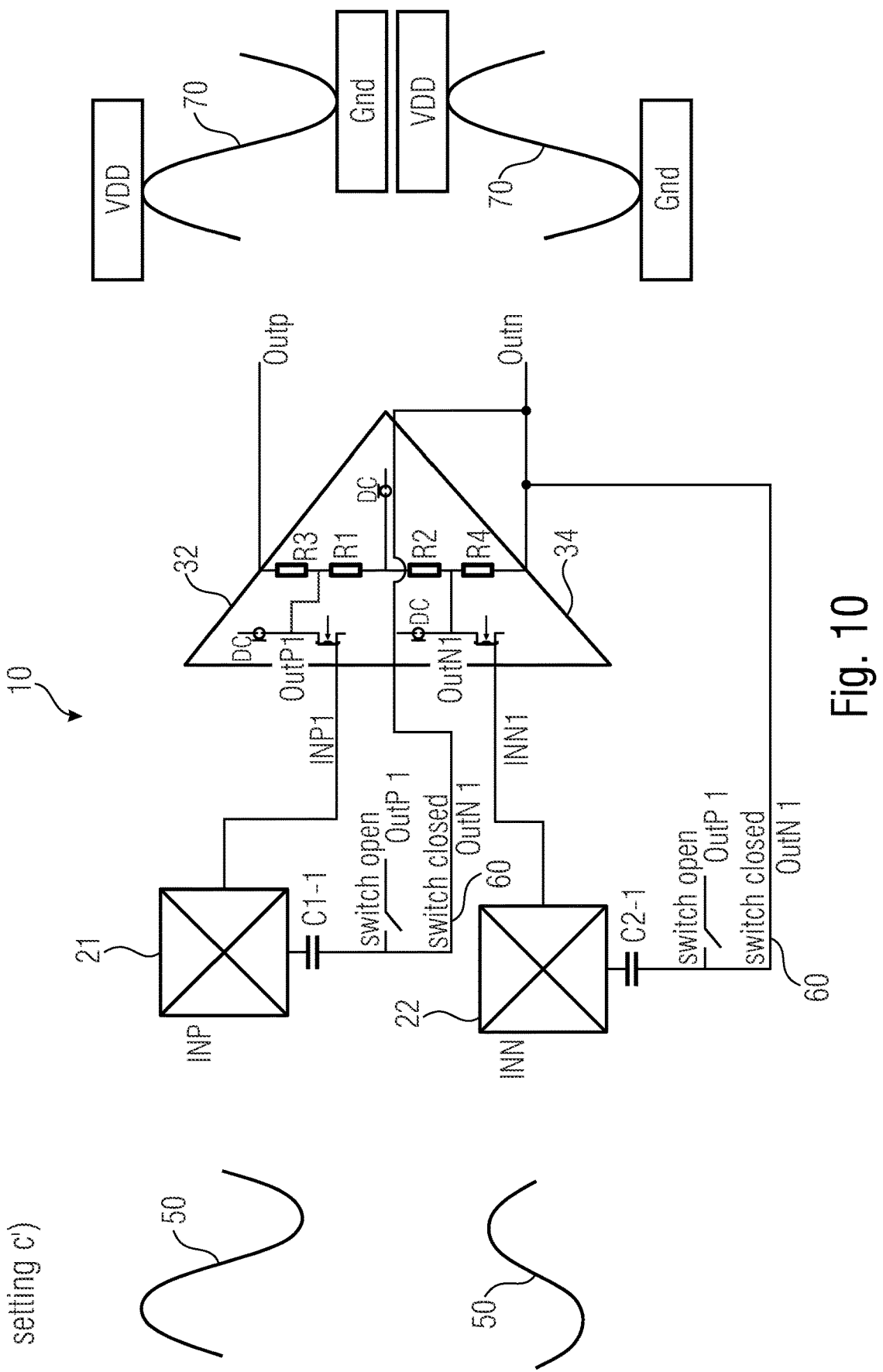
FIG. 10 shows a schematic of a differential MEMS-readout circuit.

FIGS. 9 and 10 are described together, since FIGS. 9 and 10 show similar setting c and c'.

For example, if the input signal 50 at INP is larger compared to the input signal 50 at INN (see for example, reference signs 120, 130 in FIG. 1b or FIGS. 9 and 10), than the second contact pin C1-1 of the first capacitance C1 is connected to the first Outn1 or second output Outn of the second transistor circuit 34. In this case, the first capacitance C1 acts as two times present. The second contact pin C2-1 of second capacitance C2 is also connected to the first Outn1 or second output Outn of the second transistor circuit 34 (compare with FIGS. 9 and 10 showing the settings c and c'). The second capacitance C2 is acting as it was not present, since the first and second contact pins INN, C2-1 of the second capacitance C2 are impinged with the same in-phase signal.

For the configuration as shown in the FIGS. 1a and 2, a connection of the first inputs INP1, INN1, the first outputs OutP1, OutN1 and/or the second outputs OutP, OutN with the corresponding bonding pad 21, 22 is made by metal wires 55. If only metal wires 55 are used, the configuration of the MEMS-readout circuit 10 is fixed and will be set during manufacture of the MEMS-readout circuit 10.

The preferable solution is to have switches 60 as shown in the FIGS. 2 to 10, wherein the switches 60 provide a connection either to Gnd (not shown), or from the first input INP of the first capacitance 21, C1 to the first or second output outN1, outN of the second transistor circuit 34 (see FIGS. 9 and 10, i.e. settings c and c'), or from the first input INP of the first capacitance 21, C1 to the first or second output outP1, outP of the first transistor circuit 32 (see FIGS. 4 and 6, i.e. settings d and d'), from the first input INN of the second capacitance C2, 22 to the first or second output outN1outN of the second transistor circuit 34 (see FIGS. 3 and 5, i.e. settings a and a'), or from the first input INN of the second capacitance C2, 22 to the first or second output outP1, outP of the first transistor circuit 32 (see FIGS. 7 and 8, i.e. settings b and b'). During calibration of a system no comprising the differential readout circuit 10 and the MEMS-device 100 the switches 60 will be set accordingly, so that a possible amplitude difference from the input signals 50 of the MEMS-device 100 will be compensated. Thus preferably, a connection of the first outputs OutP1, OutN1 and/or the second outputs OutP, OutN with the corresponding bonding pad 21, 22 is made by switches 60. Depending on the preferred setting, the switches 60 are opened or closed so that the connections between the second contact pins C1-1, C2-1 to one of the first and/or second outputs OutP1, OutN1, OutP, OutN is obtained as just described with respect to the FIGS. 3 to 10. Using switches 60 instead of metal wires 55 allows for amending in situ the setting of the configuration, i.e. during a calibration of a system no.

Therefore, according to an example, each input bonding pad 21, 22 is connected to two switches 60 for switching between the first outputs OutP1, OutN1, in particular of the first and second transistor circuits 32, 34, and/or the second outputs OutP, OutN, in particular of the first and second transistor circuits 32, 34, and the corresponding bonding pad 21, 22. In each switching state one of the two switches 60 associated with one of the input bonding pads 21, 22 is opened while the other is closed (compare the switching states as shown in FIGS. 3 to 10).

The MEMS-readout circuit 10 as shown in the FIGS. 1a, 2 to 10 is configured to provide a signal transfer function to reduce a difference between the signals 70 at the second output OutP and at the second output OutN of the readout amplifier section 30. For, example, the second output OutP, in particular of the first transistor circuit 32, is configured to be a positive output, while the second output OutN, in particular of the second transistor circuit 34, is configured to be a negative output. According to an example, one of the second inputs is a positive input INP while the other of the second inputs is a negative input INN or wherein one of the second input is a negative input INN while the other of the second input is a positive input INP. As shown in the FIGS. 1a, 2 to 10 the second input INN1 of the second transistor circuit 34 is a negative input INN1 while the second input INP1 of the first transistor circuit 32 is a positive input INP1. However, both options as just disclosed are possible.

With regard to the FIG. 3 and/or FIG. 5, for example, the MEMS-readout circuit 10 behave as follows: If the first contact pin INP, which in particular can be a positive contact pin, of the first capacitance C1 is connected to the positive output of the MEMS-device and the second contact pin C1-1 of the first capacitance C1 is connected to the first output OutP1, which in particular can be a positive first output, or to the second output OutP of the first transistor circuit 32 of the readout amplifier section 30, the first capacitance C1 acts as it is not present, because the first and second contact pins INP, C1-1 of the first capacitance C1 are switched in phase. Accordingly, the same situation can be applied to the second capacitance C2. Then, if the first contact pin INN, which in particular can be a negative contact pin, of the second capacitance C2 is connected to the negative output of the MEMS-device and the second contact pin C2-1 of the second capacitance C2 is connected to the first output OutN1, which in particular can be a negative first output, or to the second output OutN of the second transistor circuit 34 of the readout amplifier section 30, the second capacitance C2 acts as it is not present, because the first and second contact pins INN, C2-1 of the second capacitance C2 are switched in phase.

With regard to the FIG. 4 and/or FIG. 6, for example, the MEMS-readout circuit 10 behave as follows: If the first, in particular positive, contact pin INP of the first capacitance C1 is connected to the positive output of the MEMS-device and the second contact pin C1-1 of the first capacitance C1 is connected to the first, in particular negative, output OutN1 or to the second output OutN of the second transistor circuit 34 of the readout amplifier section 30 or to ground Gnd, the first capacitance C1 acts as attenuator of the input signal. Accordingly, the same situation can be applied to the second capacitance C2. Then, if the first contact pin INN of the second capacitance C2 is connected to the negative output of the MEMS-device and the second contact pin C2-1 of the second capacitance C2 is connected to the first, in particular positive, output OutP1 or to the second output OutP of the first transistor circuit 32 of the readout amplifier section 30 or to ground gnd, the second capacitance C2 acts as attenuator of the input signal.

With regard to the FIG. 7 and/or FIG. 8 for example, the MEMS-readout circuit is configured as follows. If the first contact pin INP of the first capacitance C1 is connected to the positive output of a MEMS-device 100 and the second contact pin C1-1 of the first capacitance C1 is connected to the first output OutP1 or to the second output OutP of the first transistor circuit 32 of the readout amplifier section 30, and if first contact pin INN of the second capacitance C2 is connected to the negative output of the MEMS-device 100 and the second contact pin C2-1 of the second capacitance C2 is connected to the first output OutP1 or to the second output OutP of the first transistor circuit 32 of the readout amplifier section 30, a difference between amplitudes of signals at the first contact pins INP, INN of the first and second capacitances C1, C2 is compensated. These configurations describe the settings b and b', as illustrated in FIGS. 7 and 8.

With regard to the FIG. 9 and/or FIG. 10 for example, the MEMS-readout circuit is configured as follows. If the first contact pin INP of the first capacitance C1 is connected to the positive output of a MEMS-device 100 and the second contact pin C1-1 of the first capacitance C1 is connected to the first output OutN1 or to the second output OutN of the second transistor circuit 34 of the readout amplifier section 30, and if first contact pin INN of the second capacitance C2 is connected to the negative output of a MEMS-device 100 and the second contact pin C2-1 of the second capacitance C2 is connected to the first output OutN1 or to the second output OutN of the second transistor circuit 34 of the readout amplifier section 30, a difference between amplitudes of signals at the first contact pins INP, INN of the first and second capacitances C1, C2 is compensated. These configurations describe the settings c and c', as illustrated in FIGS. 9 and 10.

The settings b, b', c, and c' are preferably used, if the signals 50 at the inputs INN and INP have a differing amplitude.

With this method i.e., way of coupling the output of the capacitance C1, C2 with the output of the transistor circuits 32, 34, it is possible to achieve a gain symmetry of up to 1 to 2 dB depending on the capacitance value, resulting in a better THD of high sound pressure signals also of plus 1 to 2 dB. Thus, according to an example, a gain symmetry of up to 1 to 2 dB is achieved, depending on the capacitance of the input bonding pad 21, 22.

According to an example, the differential-readout amplifier section 30 comprises a number of resistors R1, R2, R3, R4 that are configured to be switched depending on the received differential signals so that a difference between the received differential signals is reduced, in particular at the second outputs OutP, OutN of the differential-readout amplifier section 30. A reduction of the difference between the received differential signals is indicated in the FIGS. 3 to 10 for example by the output signals 70 compared to the input signal 50. Such a reduction of the difference between the received differential signals is technically achieved by the differential-readout amplifier section 30, in particular by the settings b, b', c and c' (FIGS. 7 to 10), which a preferably chosen if asymmetric input signals 50 occur. The differential-readout amplifier section 30 comprises the number of resistors R1, R2, R3, R4 that are switched accordingly for obtaining output signals 70 that do have a comparable, in particular similar, scale. The resistors R1, R2, R3, R4 are used for applying gain to the output signals 70 at the second outputs Outp and Outn according to:

$$\text{Signal}(Outp) = \text{signal}(InP) * \frac{(R1 + R3)}{R1};$$

$$\text{Signal}(OutN) = \text{signal}(InN) * \frac{(R4 + R2)}{R2}.$$

The input signals 50, i.e. signal (inp) and signal (inn), may be buffered signals. For R1=R2 and R3=R4 the same gains output for the output signals 70 at the second output OutN, OutP is obtained. For R1≠R2 and/or R3≠R4 the gain obtained for the output signals 70 at the second output OutN, OutP can be controlled separately. The gains control may be achieved by choosing the resistance values of the resistors R1, R2, R3, R4 accordingly and/or by coupling the resistors R1, R2, R3, R4 with the output outN1, outP1, as already described accordingly.

The FIGS. 11 to 15 show simulated values obtained for a coupling of the first and second capacitances C1, C2 coupled to one of the first and/or second outputs OutN1, OutN, OutP1, OutP according to the settings a, a', b, b', c, c', d and d'. The simulated values are shown as x and are connected with one another.

It is noted that the results of setting a are similar to the results of setting a'. The results of setting b are similar to the results of setting b'. The results of setting c are similar to the results of setting c'. The results of setting d are similar to the results of setting d'. That is why the settings a and a' etc. are shown in the FIGS. 11 to 15 at the same point.

Figure 11:
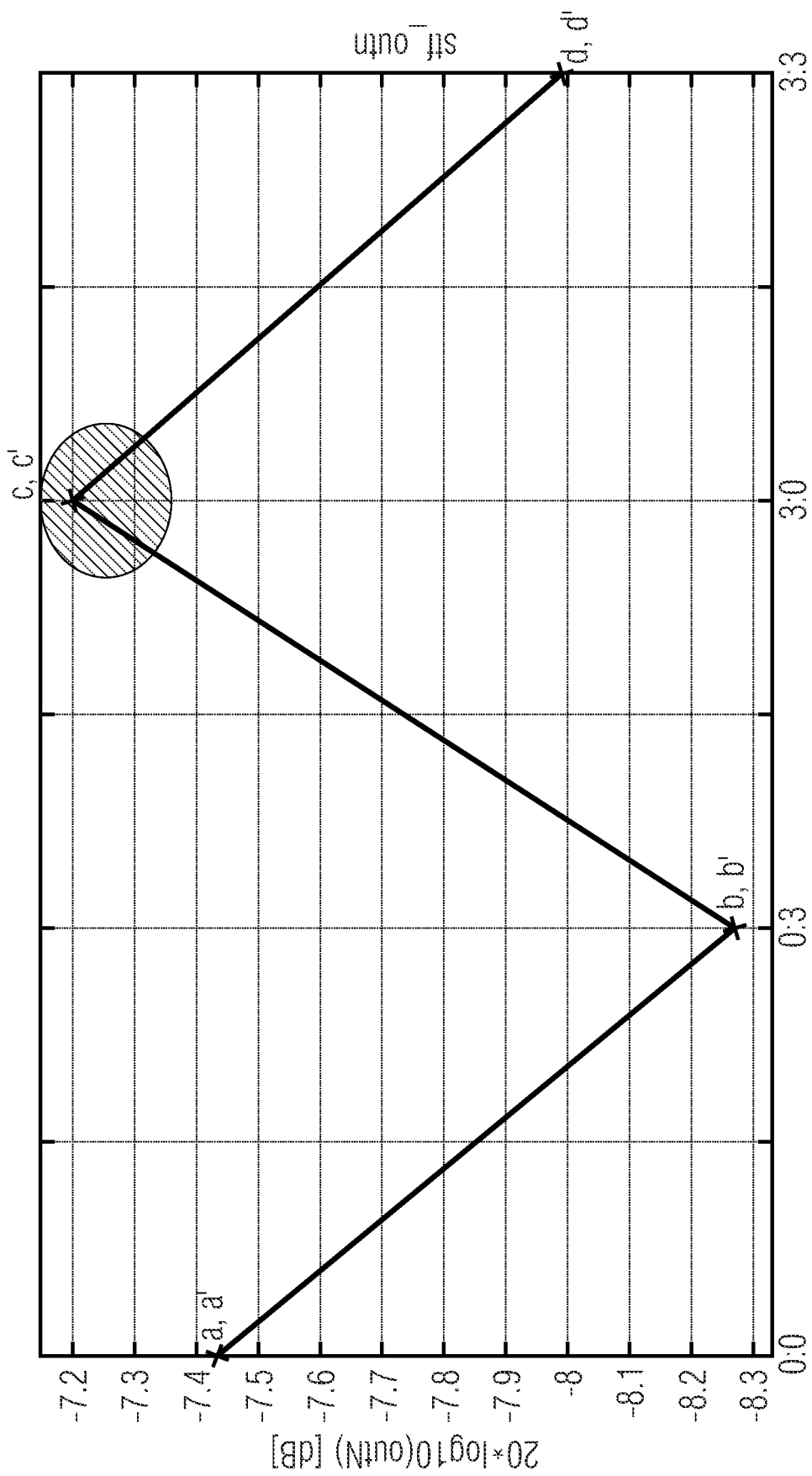
FIG. 11 shows a simulation of the signal at output outn of the signal transfer function.
Figure 12:
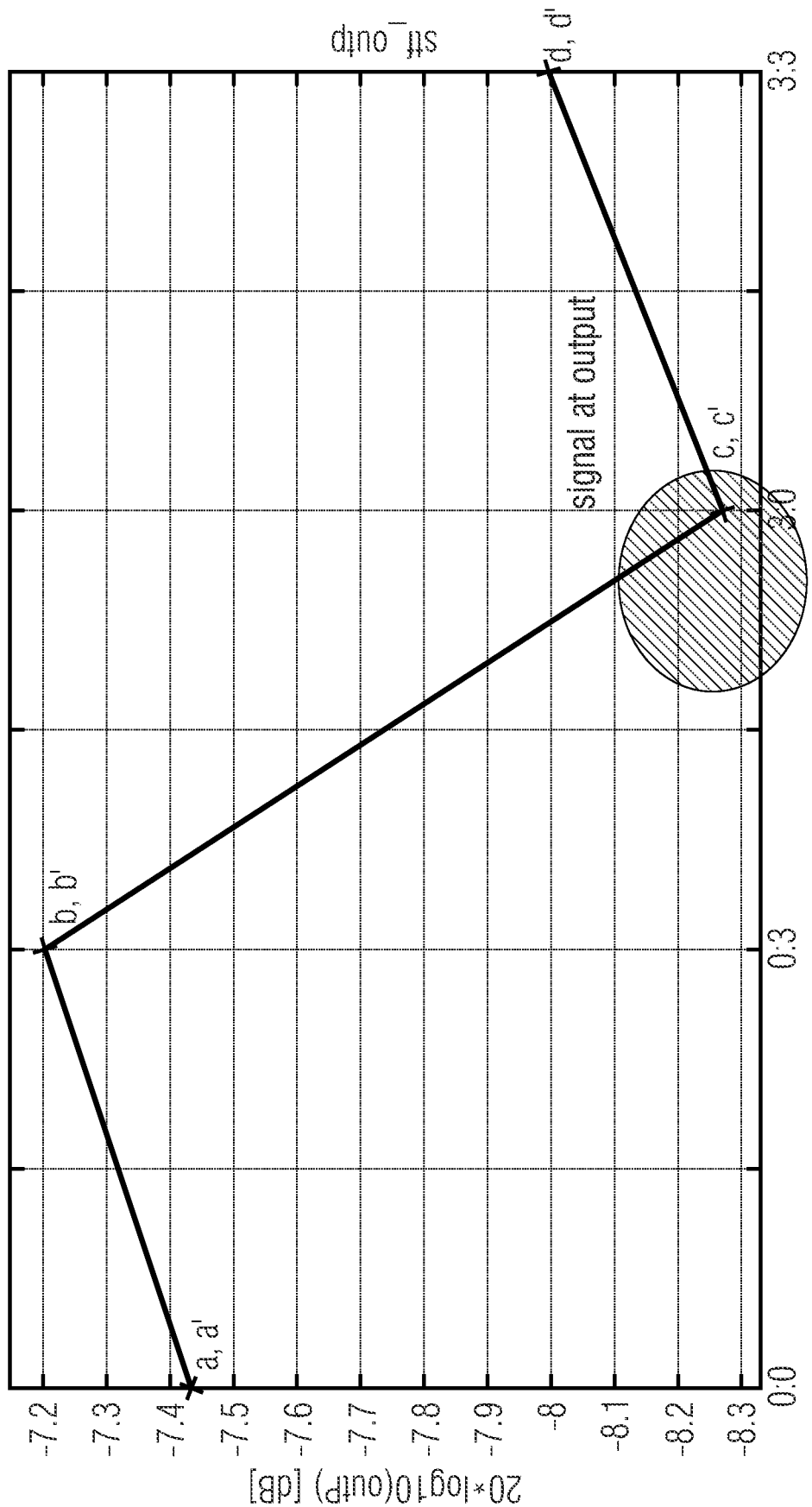
FIG. 12 shows a simulation of the signal at output outp of the signal transfer function.
Figure 13:
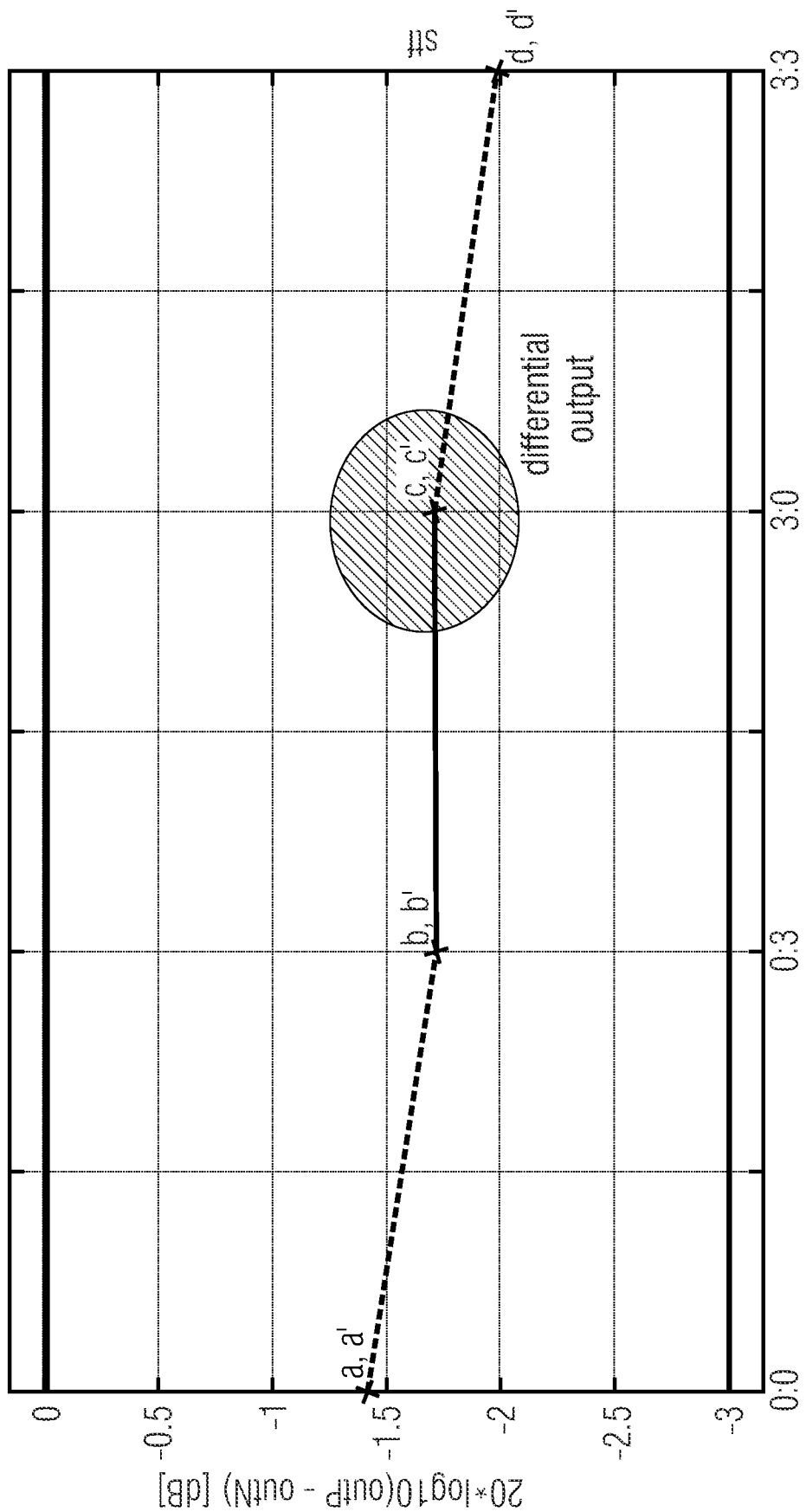
FIG. 13 shows a simulation of the differential output (=outp−outn) derived from the signals according to FIGS. 11 and 12.

In synopsis of the FIGS. 11 to 13, a simulation of the signal transfer function for four settings {a=0:0; b=0:3; c=3:0; d=3:3} or {a'=0:0; b'=0:3; c'=3:0; d'=3:3} respectively of the switches 60 for the first and second outputs OutN1, OutN, OutP1, OutP is presented. The signal transfer function comprises signals at the outputs (OutN1, OutN, OutP1, OutP, and a differential output signal. The settings {0:0; 0:3; 3:0; 3:3} are associated with switching states of the switches 60, in particular, the settings a, a', b, B', c, c', d, d' that are illustrated in FIGS. 3 to 10. The settings as shown in the FIGS. 3 to 10 are summarized in table 1.

TABLE 1

| Setting | Connect C1 (INP) to | Connect c2 (INN) to |
|---|---|---|
| a or (0:0) | OutP1 | OutN1 |
| a' or (0:0) | OutP | OutN |
| b or (0:3) | OutP1 | OutP1 |
| b' or (0:3) | OutP | OutP |
| c or (3:0) | OutN1 | OutN1 |
| c' or (3:0) | OutN | OutN |
| d or (3:3) | OutN1 | OutP1 |
| d' or (3:3) | OutN | OutP |

FIG. 11 shows a simulation of the output signal 70 (signal (OutN) at the second output OutN of the signal transfer function. FIG. 12 shows a simulation of the output signal 70 (signal (OutP) at second output OutP of the signal transfer function. The difference between both signals as shown in FIGS. 11 and 12 is shown in FIG. 13. Thus, FIG. 13 shows a simulation of the differential output (~OutP−OutN) derived from the output signals 70 (signal (OutP), signal (OutN)) at second outputs OutP, OutN. The settings as summarized in table 1 are used for resulting the simulations results shown in FIGS. 11 to 13.

The settings a, a' and d, d' do not change the amplitudes from the MEMS-device 100. With respect to setting a, a', the differential output signal determined according to 20*log 10 (outP−outN) and shown in FIG. 13 has a value deviating from the differential output signals of settings c, c', b, b'. Also, with respect to setting d, d', the differential output signal determined according to 20*log 10 (outP−outN) and shown in FIG. 13 has a value deviating from the differential output signals of settings c, c', b, b'. Compared to the differential output signals for settings b, b', c, c' (~−1.7) the differential output signal for setting d, d' (~−2) is smaller with respect to absolute values than for settings b, b', c, c' (~−1.7) (both shown in FIG. 13), while the differential output signal for setting a, a' (~−1.4) is larger with respect to absolute values than for settings b, b', c, c' (~−1.7) (both shown in FIG. 13). With setting a, a' the bond pad capacitances C1, C2 act as they were not present. That is why the differential output signal is absolutely larger than for setting d, d'. With setting d, d' the bond pad capacitances C1, C2 act as twice implemented.

When considering the values shown in FIGS. 11 and 12, the output signals at outN and outP for settings a, a' both are proportional to ~−7.45, while output signals at outN and outP for settings d, d' both are proportional to ~−8. This is different for the settings b, b', c, c'. The output signal at OutN (FIG. 11) for setting b, b' is proportional to ~−8.3, while the output signal at OutP (FIG. 12) for setting b, b' is proportional to ~−7.2. With respect to the setting c, c' this behavior is vice versa, i.e. the output signal at OutN (FIG. 11) for setting c, c' is proportional to ~−7.2, while the output signal at OutP (FIG. 12) for setting c, c' is proportional to ~−8.3. That is why the resulting differential output signal shown in FIG. 13 is essentially constant for setting b, b', c, c'. This mean, with settings b, b', c, c' an asymmetric MEMS-signal from the MEMS-device 100 can be compensated.

Figure 14A:
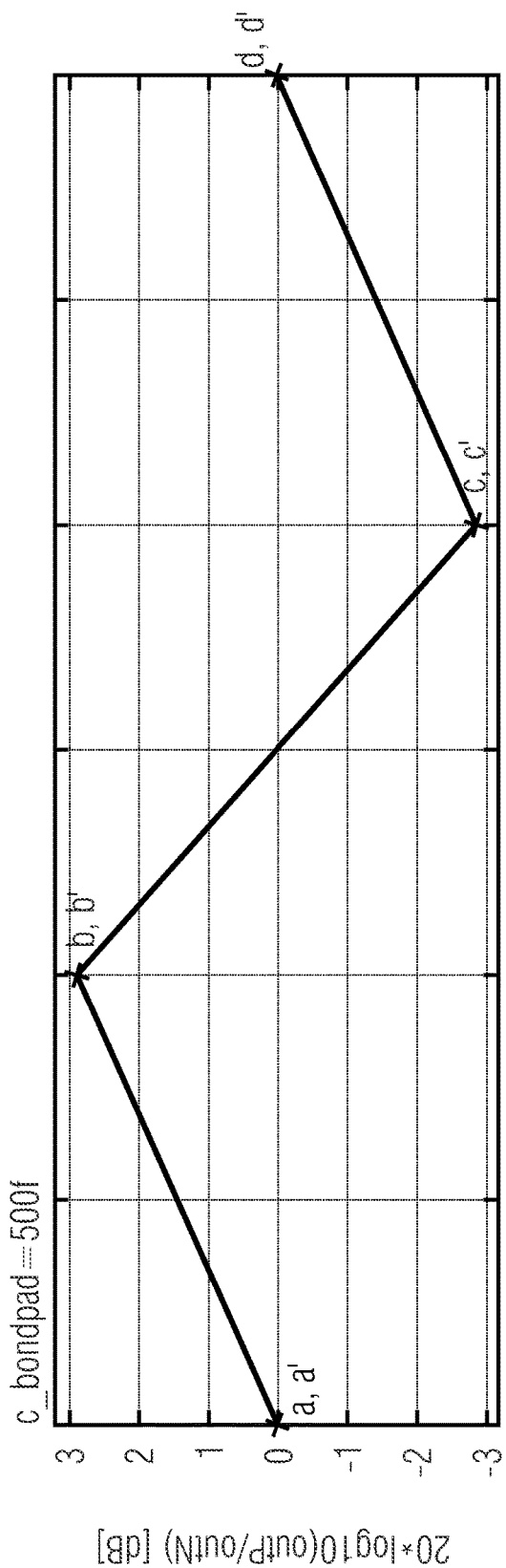
FIGS. 14a and 14b, show simulations of the ratio of the outputs (=outp/outn) for bond pad capacities of C1=C2=500 f (FIG. 14a) and C1=C2=300 f (FIG. 14b)
Figure 14B:
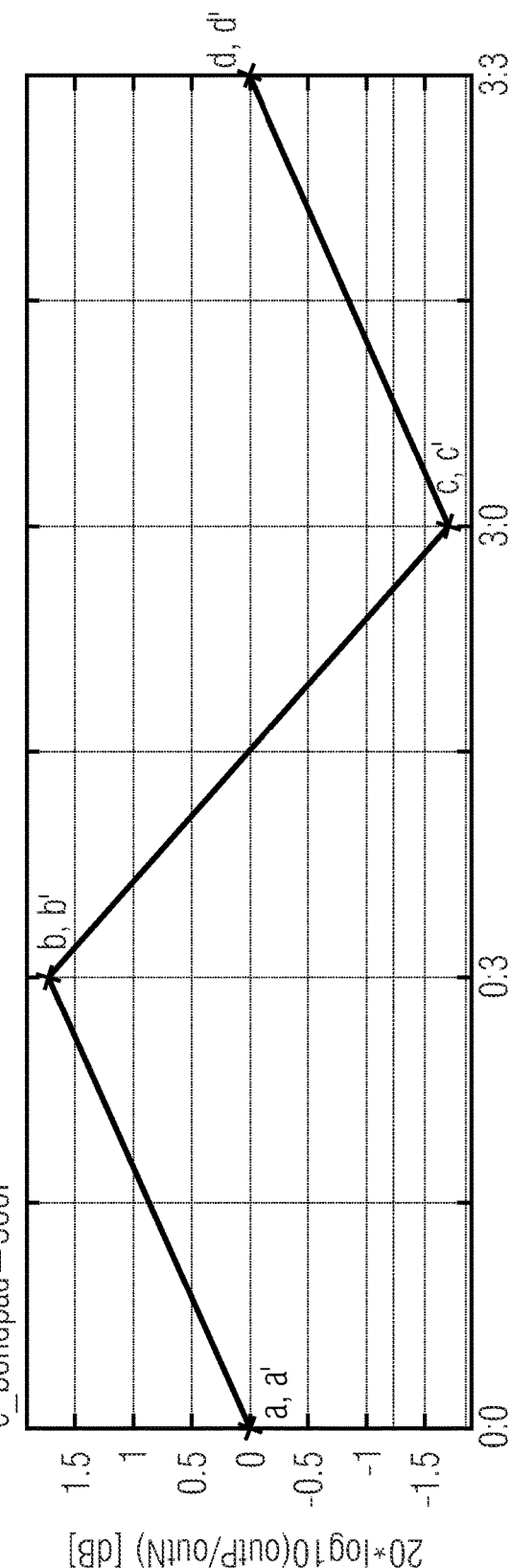
Figure 15A:
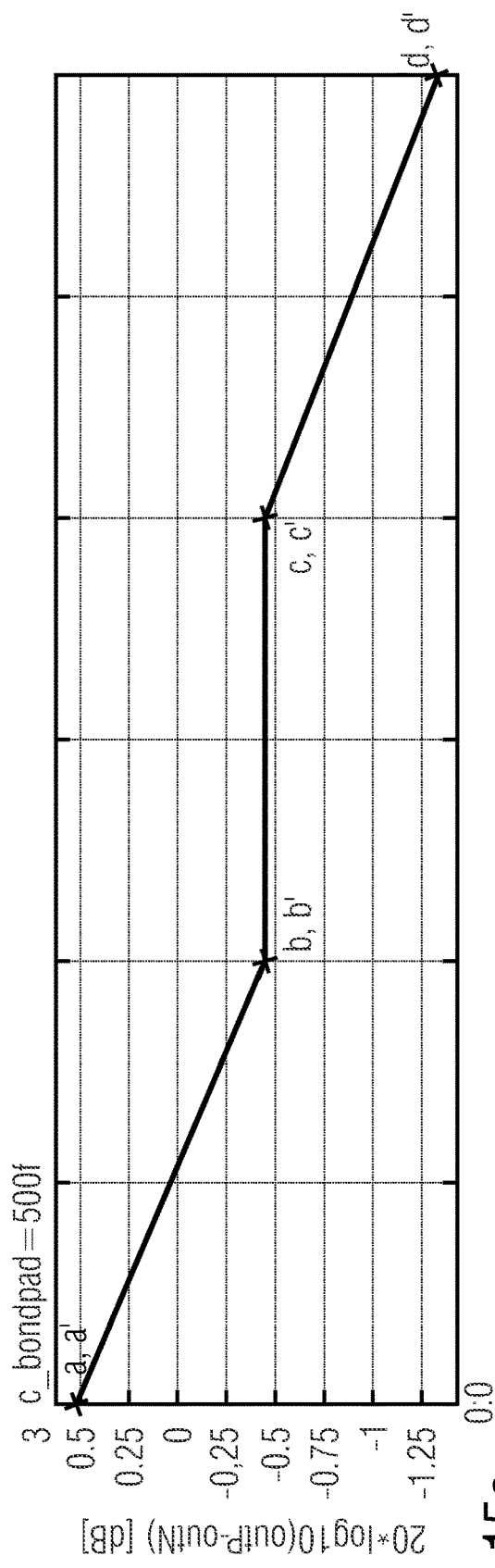
FIGS. 15a, 15b show simulations of the differential output (=outp−outn) for bond pad capacities of C1=C2=500 f (FIG. 15a) and C1=C2=300 f (FIG. 15b)
Figure 15B:
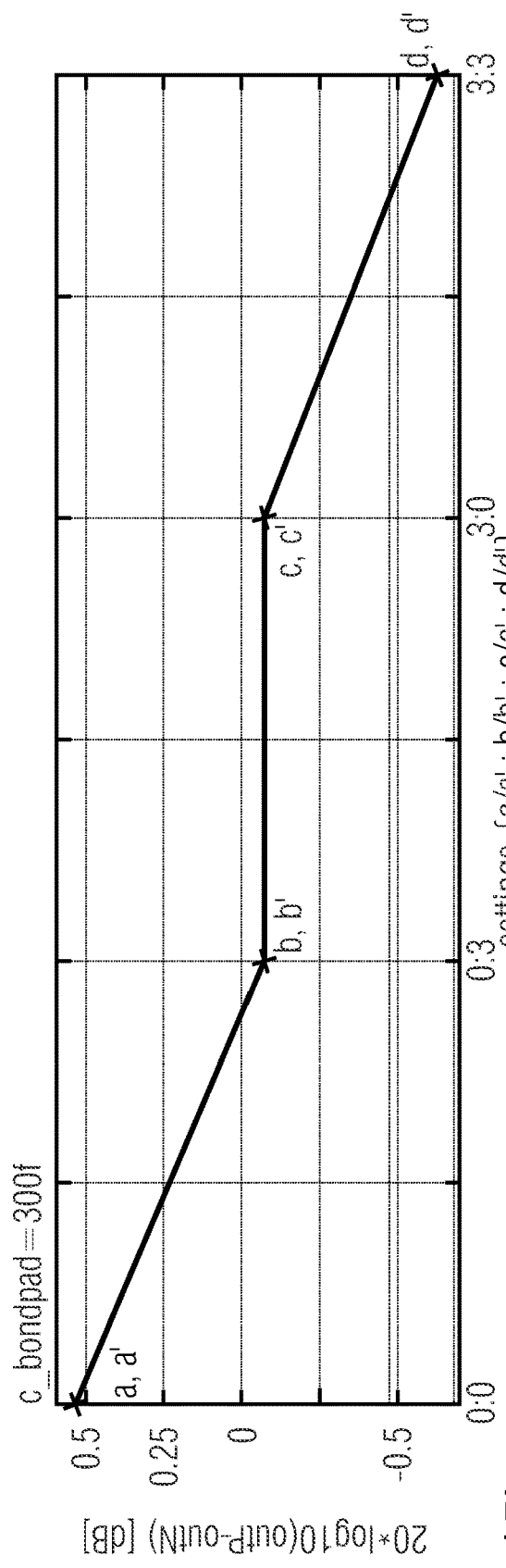

FIG. 14a and FIG. 14b show each the ratio of the signals at output OutP and at output OutP according to the function 20*log 10 (outP/outN) for a bond capacitance of C=C2=500 fF (FIG. 14a) and a bond capacitance of C1=C2=300 fF (FIG. 14b). FIG. 15a and FIG. 15b show each the differential output signals of the signals at output OutP and at output OutP according to the function 20*log 10 (outP−outN) for a bond capacitance of 500 fF (FIG. 15a) and a bond capacitance of 300 fF (FIG. 15b). For asymmetric signals and settings b, b', c, c' the ration may be up to 3 dB for a bond pad capacitance of 500 fF (see FIG. 14a). With the settings d, d', there is less signal at both outputs OutN, OutP of the ASOC, because the corresponding bond pad capacitance acts two times implemented (FIGS. 15a, 15b). For setting a, a', a larger differential output signal is available at the output OutN, OutP (see FIGS. 15a, 15b), The settings a, a', d, d' may be chosen, if the MEMS-device 100 delivers signals 50 of the same amplitude. If there is a difference of the signal amplitudes of the MEMS-device 100 at INP, INN, settings b, b' or c, c' may be used to get zero difference at the outputs outP, outN (see the constant differential output signal in FIGS. 15a and 15b for settings b, b', c, c').

As already mentioned, FIG. 14 shows the ratio of the signal at outp to the signal at outn according to 20*log 10(outp/outn). Therewith, FIGS. 14a, 14b, each shows the possible range for changing the amplitude of a signal 50. FIG. 11 shows the single ended output at OutN or at outP in FIG. 12. The difference is zero for the settings a, a', d, d' (as described above). With settings b, b', c, c' either too large signals on input INP could be increased or decreased, same holds for input INN.

FIGS. 13 and 15a, 15b show the difference at outp and outn in dB, i.e. the differential output signal determined according to 20*log 10(outp−outn). Here it is only shown that more signal is achieved for setting a, a' than for setting d, d'. FIGS. 13 and 15a, 15b give no information, if the signals at output outp, outn are equal or if they differ.

For example, for the setting at 0:3, i.e. setting b, b', of FIGS. 14a and 14b the second capacitance C2 was coupled to the first output outP1 and the first capacitance C1 was coupled to the first output outP1 (see also table 1). This means both capacitances C1 and C2 were coupled to the first output outP1. Also, for the setting at 3:0, i.e. setting c, c', of FIGS. 14a and 14b, both capacitances C1 and C2 were coupled to the first output outN1. For the setting 0:3, i.e. setting b, b' the signal at output OutP1 is obtained by:

$$\text{Signal}(OutP1) = \text{signal}(INP)$$

C1 is the first capacitance that is in phase with the input signal.

The signal at output OutN1 is obtained by:

$$\text{Signal}(OutN_1) = \text{signal}(INN) * \frac{Cm}{(Cm + C2 * C2)} :$$

C2 is the second capacitance that is connected to the 180° shifted output outP1/outP and therefor doubles.

For the setting 3:0, i.e. the setting c, c', the signal at output OutP1 is obtained by:

$$\text{Signal}(OutP_1) = \text{signal}(INP) * \frac{Cm}{(Cm + 2 * C1)}.$$

The signal at output OutN1 is obtained by:

$$\text{Signal}(OutN1) = \text{signal}(INN).$$

The signal at output OutN was attenuated for setting 0:3 (b, b'), and the signal at output OutP was attenuated for setting 3:0 (c, c'). For the settings at 0:0 (a, a') and 3:3 (d, d') the first capacitance C1 was either coupled to OutN1 or to OutP1, while the second capacitance C2 was either coupled to OutP1 or to OutN1 (see FIGS. 3 to 6 and table 1). The differential output signal (20*log 10 signal(OutP−OutN)) was derived from the second outputs OutP, OutN.

For the settings 0:0 and 3:3 the logarithmic ratio of signals 70 at the outputs outp, outn is close to zero (FIGS. 13, 14a, 14b), while for the settings 0:3 and 3:0 the difference of the differential output signals 70 is unequal to zero. The greater the capacitance C1 and C2 are chosen, the more the differential output signals 70 is away from zero (compare the setting at 0:3 and 3:3 in FIGS. 14a and 14b).

The simulation results shown in FIGS. 11 to 15 were obtained by coupling the first and the second capacitances C1, C2 with the first outputs OutP1, OutN1. A coupling of the capacitances C1, C2 with the first outputs OutP, OutN is also possible. That is why the setting a', b', c', and d' are also indicated in FIGS. 11 to 15. The results obtained for the settings a', b', c', and d' are similar, i.e. essentially equal, than that obtained for the settings, a, b, c, and d.

With the settings b, b', c and c as described with respect to the FIGS. 7 to 10 asymmetric input signals 50 at INN and INP may be compensated. In order to have the flexibility to choose one of the settings, a, a', b, b', c, c', d or d' (according to one of the FIGS. 3 to 10) the switches 60 are accordingly switched.

Figure 16:
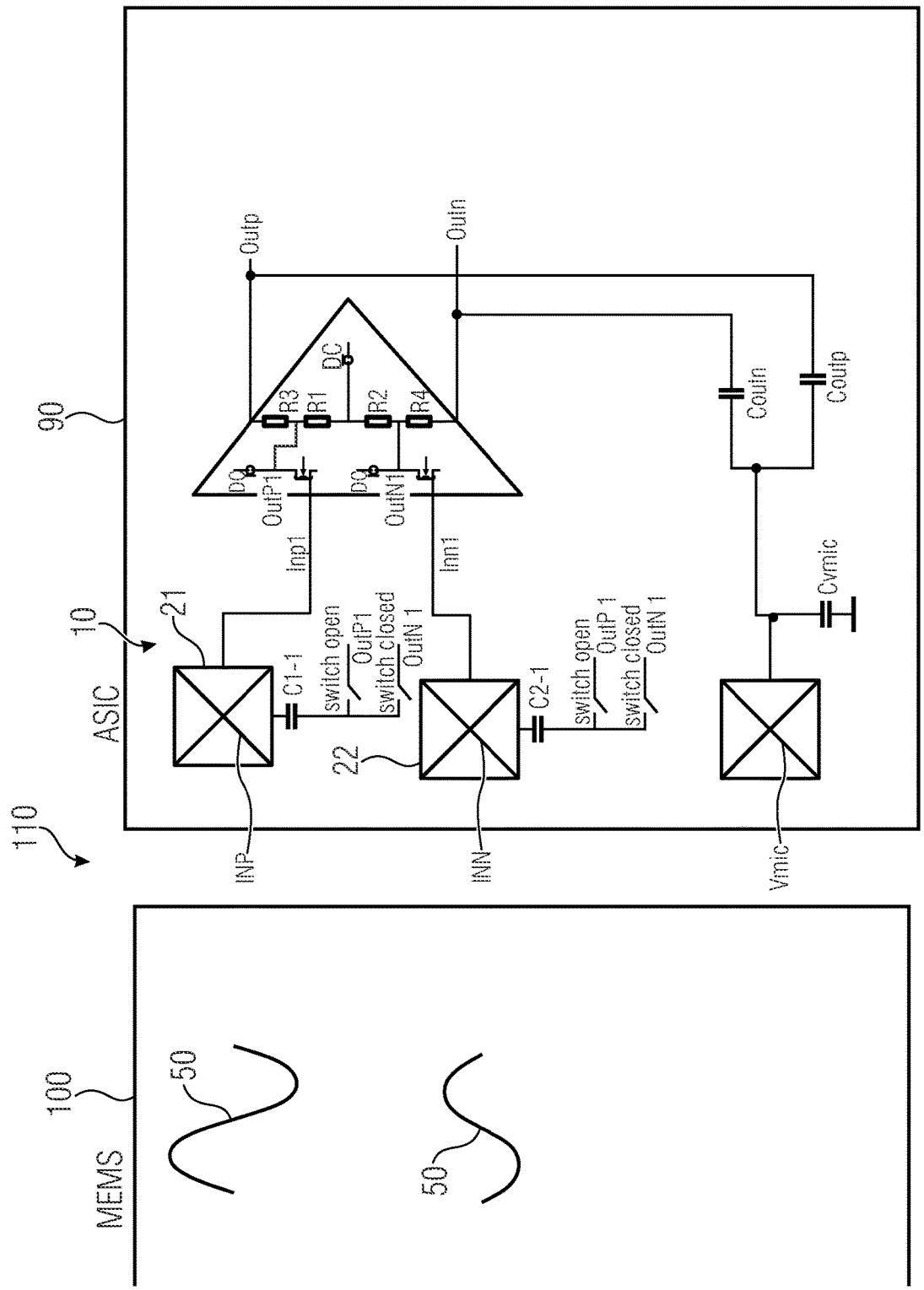
FIG. 16 shows a schematic of a differential MEMS-readout circuit, wherein the differential MEMS-readout circuit is coupled to a MEMS-device and is coupled to a voltage node of the MEMS-device for generating feedback to the voltage node.
Figure 18:
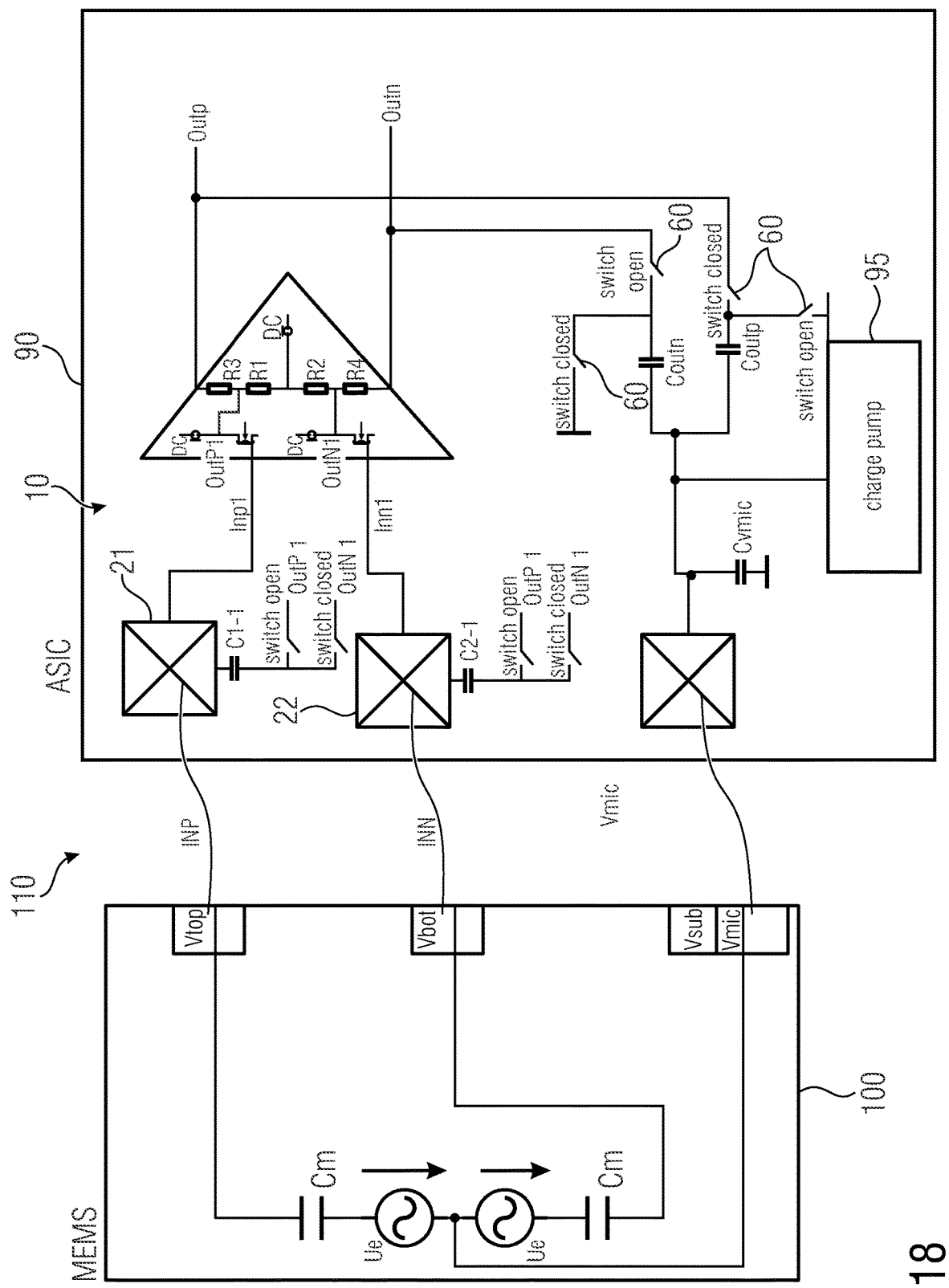
FIG. 18 shows a schematic of a differential MEMS-readout circuit, wherein the differential MEMS-readout circuit is coupled to a MEMS-device and is coupled to a voltage node of the MEMS-device for generating feedback to the voltage node.

Alternatively, in order to compensate asymmetric input signals 50 the first outputs outP1, outN1 or the second outputs outP, outN of the first and second transistor circuits 32, 34 are connected to a voltage node Vmic of the MEMS-device 100 for generating a feedback lined back to the MEMS-readout circuit 10. In FIGS. 16 and 18 the connection to the second outputs outP, outN is shown, while the connection to the first outputs outP1, outN1 is not shown in FIGS. 16 and 18. Then a difference between amplitudes of signals 50 at the first contact pins INP, INN of the first and second capacitances (C1, C2) is compensated by switching capacitances Coutn, Coutp. The capacitances Coutn, Coutp are provided in a path between the second outputs outP, outN and the voltage node Vmic. The capacitances Coutn, Coutp are switched accordingly, in particular by switching switches 60 that are associated with the capacitances Coutn, Coutp and that are associated with ground Gnd. This is, for example, shown in FIG. 18.

Both outputs, the first outputs outP1, outN1 or the second outputs outP, outN, are needed for compensation (as shown in FIGS. 16 and 18), since a capacitance from outp/outp1 to Vmic can only increase the ratio outP/outN or outp1/outn1 respectively, whereas a capacitance from outn or outn1 to Vmic decreases the ratio outp/outn or outp1/outn1 respectively. If the MEMS delivers a symmetric signal no or the same capacitances between Vmic and outp1/outp, Vmic and outn1/outn will be connected. There would be one case that only one capacitance needs to be changed. If a fixed capacitance Cfix is connected between Vmic and e.g. outn/outn1, then only the capacitance at Vmic and outp/outn1 needs to be changed. The switchable capacitance needs to be either larger than Cfix or lower than Cfix to change the ratio of the MEMS input amplitudes to values larger and smaller than 1.

The voltage at the voltage node Vmic is a bias voltage for the MEMS-device 100, in particular the bias voltage is generated with a charge pump 95. For example, the bias voltage is generated at an ASIC. For example, the bias voltage is generated with a charge pump 95. This is, for example, shown in FIG. 16.

A further aspect of the present technical teaching is to provide a MEMS-device 100 for connection to a MEMS-readout circuit 10 as described herein. The MEMS device 100 is configured to act as a differential type sensor to provide at the first contact pins (INP, INN) differential signals, wherein the MEMS-readout circuit 10 is configured to receive the differential signals and to reduce a difference in the amplitude of the differential signals at the second outputs OutP, OutN as already described herein.

The proposed MEMS-device 100 together with the proposed MEMS-readout circuit 10 build a proposed system no according to a further aspect of the present technical teaching. FIG. 16 shows a system 110. For example, the MEMS-readout circuit 10 is implemented on an ASIC 90.

Figure 19:
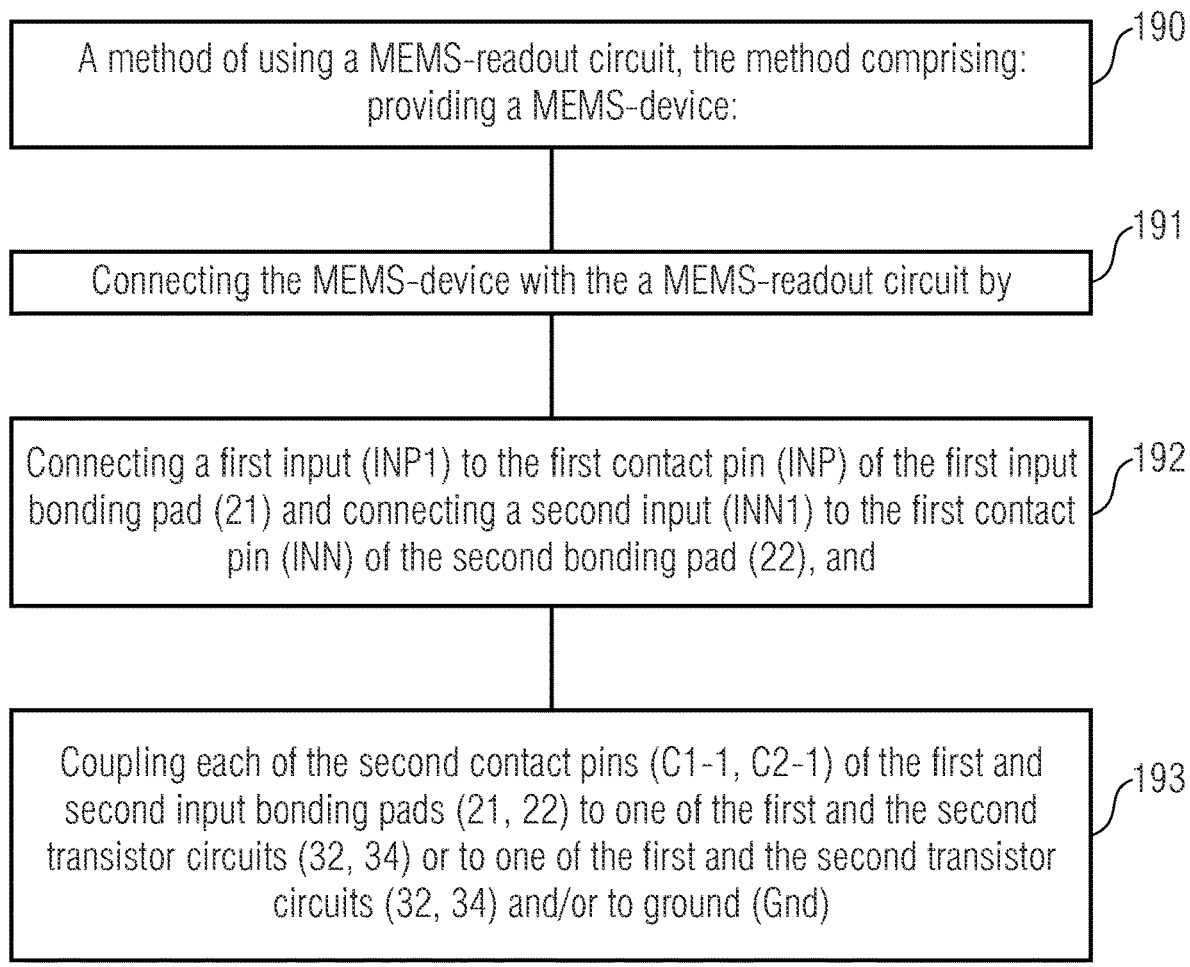
FIG. 19 shows a block diagram of a method of using a MEMS-readout circuit.

A further aspect of the present technical teaching is to provide a method of using a MEMS-readout circuit 10 as described herein. FIG. 19 presents a block diagram of a method of using a MEMS-readout circuit 10. The method comprises a step 190 of providing a MEMS-device 100. In step 191 a connecting of the MEMS-device 100 with a MEMS-readout circuit 10 is performed. The step of connecting 191 is performed by step 192 and 193.

The step 192 comprises connecting a first input INP1 to the first contact pin INP of the first input bonding pad 21 and connecting a second input INN1 to the first contact pin INN of the second bonding pad 22. The step 193 comprises coupling each of the second contact pins C1-1, C2-1 of the first and second input bonding pads 21, 22 to one of the first and the second transistor circuits 32, 34. Alternatively, the step 193 comprises coupling each of the second contact pins C1-1, C2-1 of the first and second input bonding pads 21, 22 to one of the first and the second transistor circuits (32, 34) and/or to ground (Gnd).

For example, the step 192 may comprise: connecting the first contact pin INP of the first capacitance C1 to the positive output of the MEMS-device 100 and the second contact pin C1-1 of the first capacitance C1 to the first output OutP1 of the first transistor circuit 32 of the readout amplifier section 30, so that the first capacitance C1 acts as it is not present, because the first and second contact pins INP, C1-1 of the first capacitance C1 are switched in phase. Step 193 may comprise connecting the first contact pin INN of the second capacitance C2 to the negative output of the MEMS-device 100 and the second contact pin C1-2 of the second capacitance C2 to the first output OutN1 of the second transistor circuit 34 of the readout amplifier section 30, so that the second capacitance C2 acts as it is not present, because the first and second contact pins INN, C2-1 of the second capacitance C2 are switched in phase. In this way setting a or a' is obtained.

Alternatively, for example, the step 192 may comprise: connecting the first contact pin INP of the first capacitance C1 to the positive output of the MEMS-device 100 and the second contact pin C1-1 of the first capacitance C1 to the first output OutN1 of the second transistor circuit 34 of the readout amplifier section 30 or to ground Gnd, so that the first capacitance C1 acts as attenuator of the input signal in order to reduce a difference between the differential output signals. The step 193 may then comprise connecting the first contact pin INN of the second capacitance C2 to the negative output of the MEMS-device 100 and the second contact pin C2-1 of the second capacitance C2 to the first output OutP1 of the first transistor circuit 32 of the readout amplifier section 30 or to ground Gnd, so that the second capacitance C2 acts as attenuator of the input signal in order to reduce a difference between the differential output signals. In this way setting d or d' is obtained.

Alternatively, for example, the step 192 may comprise: connecting the first contact pin INP of the first capacitance C1 to the positive output of a MEMS-device 100 and connecting the second contact pin C1-1 of the first capacitance C1 to the first output OutP1 or to the second output OutP of the first transistor circuit 32 of the readout amplifier section 30. Then, step 193 may comprise connecting the first contact pin INN of the second capacitance C2 to the negative output of a MEMS-device 100 and connecting the second contact pin C2-1 of the second capacitance C2 to the first output OutP1 or to the second output OutP of the first transistor circuit 32 of the readout amplifier section 30. In doing so, a difference between amplitudes of signals at the first contact pins INP, INN of the first and second capacitances C1, C2 is compensated. In this way setting b or b' is obtained.

Alternatively, for example, the step 192 may comprise: connecting the first contact pin INP of the first capacitance C1 to the positive output of a MEMS-device 100 and connecting the second contact pin C1-1 of the first capacitance C1 to the first output OutN1 or to the second output OutN of the second transistor circuit 34 of the readout amplifier section 30. Then, step 193 may comprise connecting the first contact pin INN of the second capacitance C2 to the negative output of a MEMS-device 100 and connecting the second contact pin C2-1 of the second capacitance C2 to the first output OutN1 or to the second output OutN of the second transistor circuit 34 of the readout amplifier section 30. In doing so, a difference between amplitudes of signals at the first contact pins INP, INN of the first and second capacitances C1, C2 is compensated. In this way setting c or c' is obtained.

In particular the alternatives of steps 192 and 193 may be combined in any combination, so that the output of the capacitance C1, C2 are connected to any output of the MEMS-device and to any output of the differential-readout amplifier section 30, i.e. outN1, outN, outP1 and/or outN1.

According to an example, the method 130 may comprise a step of applying gain to the second output OutP of the first transistor circuit 32 by using a number of resistors R1, R2, R3, R4, wherein an input signal 50 is converted at the second output (outP) into an output signal according to signal (Outp)=signal(inP)*(R1+R3)/R1; wherein the input signal is a combined signal from the first output (outP1) and the first input (INP1) of the of the first transistor circuit 32.

The method 130 may alternatively or additionally comprise a step of applying gain to the second output (OutN)) of the second transistor circuit 34 by using the number of resistors R1, R2, R3, R4, wherein an input signal is converted at the second output (outN) into an output signal according to signal(OutN)=signal (InN)*(R4+R2)/R2, wherein the input signal (InN) is a combined signal from the first output (outN1) and the first input (INN1) of the of the second transistor circuit 34.

The signals at the first output (outN1) and the first input (INN1) and/or the signals at the first output (outP1) and the first input (INP1) each depends on the input signal 50 provided by the MEMS-device 100.

According to an example, the method 130 may comprise a step of obtaining the same amount of gain at the second output (outP) of the first transistor circuit 32 and at the second output (outN) of the second transistor circuit 34, if R1=R2 and R3=R4 is valid. The resistance value of R1, R2, R3, R4 may be chosen at the manufacture process of the readout amplifier section 30. It is also possible to provide the readout amplifier section 30 with more resistors than with resistors R1, R2, R3, R4, for example additional resistors R5, R6, R7, R8 etc. For example, the additional resistors may be switched in or off in the readout amplifier section 30 by switches and depending on the needed resulting resistance of the resistors R1, R2, R3, R4. This allows to provide more flexibility. The more resistors are implemented, the more various gains settings may be chosen. In doing so or by just providing fixed resistor values that are unequal to one another, in particular if R1 is unequal to R2 and/or R3 is unequal to R4, the method 130 may comprise controlling the gain at the second output (outP) of the first transistor circuit 32 and at the second output (outN) of the second transistor circuit 34 separately.

According to an example, the method comprises connecting the second outputs outP, outN of the first and second transistor circuits 32, 34 to a voltage node Vmic of the MEMS-device 100 for generating a feedback lined back to the MEMS-readout circuit 10. A connection of the second outputs outP, outN of the first and second transistor circuits 32, 34 to a voltage node Vmic of the MEMS-device 100 is shown in FIG. 16 and FIG. 18. FIG. 16 shows a schematic of a differential MEMS-readout circuit 10, wherein the differential MEMS-readout circuit 10 is coupled to a MEMS-device 100 and is coupled to a voltage node Vmic of the MEMS-device 100 for generating feedback to the voltage node. In FIGS. 16 and 18 the circuit between the MEMS-device 100, the capacitances C1, C2 and the readout amplifier section 30 is shown only generally, wherein the connection between the capacitances C1, C2 and the readout amplifier section 30 is indicated only by switches 60. For a person skilled in the art, it is clear that any circuit between the capacitances C1, C2 and the readout amplifier section 30 described herein, preferably the ones shown in FIGS. 2 to 6, may be used for the configuration as shown in FIGS. 16 and 18 in order to generate a feedback to the voltage node Vmic of the MEMS-device 100.

FIG. 16 shows schematically a circuit with which an asymmetric gain with use of feedback of an output to Vmic may be generated. To generate said feedback the second output Outp is coupled with a capacitance Coutp, and the second output OutN is couples with a capacitance Coutn, which in turn is coupled to the voltage node Vmic of the MEMS-device 100. In doing so, an output signal at the second outputs OutP, OutN may be feed back to the MEMS-device 100. The feedback then obtained at the seconds outputs OutN, OutP due to Coutn and Coutp is given by:

$$\text{Signal(Outp)=signal(inp)}*A*(1+(\text{Coutp}-\text{Coutn})/\text{Cvmic}); \text{ and}$$

$$\text{Signal(Outn)=signal(inn)}*A*(1+(\text{Coutn}-\text{Coutp})/\text{Cvmic}).$$

Cvmic is the capacitance of a bonding pad of the voltage node Vmic. The Vmic bonding pad shown in FIGS. 16 and 18 may use a filter capacitance, for example of 10 pF. Because a desired filter capacitance of for example 8 pF to 10 pF is not reached by the bonding pad Vmic alone, an additional capacitance may be added, in order to achieve the desired filter capacitance, for example of 8 pF to 10 pF. An additional capacitance is not shown in FIGS. 16 and 18. The capacitance together with a high ohmic output resistance, for example of 10–100 GΩ, creates a lowpass to cut off significantly below the audioband of 20 Hz. A value of 8 pF to 10 pF corresponds to a lower end value of the filter capacitance. A greater value of the capacitance of for example 20 pF may be beneficial. A greater value of the capacitance may be related to a greater area of the capacitance. The factor A is the amplification factor described herein. If Coutp=Coutn is valid, no gain for the signal at outp and attenuation for the signal at outn or vice versa is possible.

As shown in FIG. 18, the capacitance Coutp is connected to the second output Outp, if the switch 60 between CoutP and Outp is closed. In this case the capacitance Coutn is connected to ground gnd. The capacitance Coutn may act as additional capacitance on the Vmic node. The ASIC 90 may a have a charge pump 95. The charge pump 95 provides a voltage Vmic for the MEMS-device 100. With the voltage Vmic the MEMS-devices' 100 sensitivity may be set. A higher voltage Vmic results in larger signals 50 at the MEMS-device outputs Vtop and Vbot. As shown in FIG. 18, the MEMS-device output Vtop is connected to the first contact pin INP of the first capacitance C1, and the output Vbot is connected to the first contact pin INN of the second capacitance C2. The feedback then obtained at the seconds outputs OutN, OutP due to Coutn and Coutp is given by:

$$\text{Signal(outp)=signal(inp)}*A*(1+\text{Coutp}/(\text{Cvmic}+\text{Coutn})), \text{ and}$$

$$\text{Signal(outn)=signal(inn)}*A*(1-\text{Coutp}/(\text{Cvmic}+\text{Coutn})).$$

Since signal(INP)=Ue and signal (INN)=−Ue is valid, wherein Ue is the voltage provided by the voltage source of the MEMS-device 100. Thus, the differential output signal is given by:

Signal(outp−outn)=Voutp−Voutn)=2*A*Ue, wherein A is again the amplification factor described herein. For the method of using a MEMS-readout circuit 10 described above the Vmic pad is not used to change a possible asymmetry of the signals at INP, INN.

However, the Vmic pad may also be used to set the signals at INP and INN to the same amplitude levels. If a capacitance Coutp is connected to a capacitance Cvmic of the Vmic pad then the capacitance Coutp creates a positive feedback from the output Outp to first contact pin INP of the first capacitance C1 (see FIG. 16 or 18). The signal at Outp is amplified. It is important that the capacitance Coutn is connected between Cvmic to ground, i.e. switch 60 to Outn should be opened, while the switch 60 to ground should be closed (in FIG. 18 switches 60 are all shown opened in order to indicate the switch as such). Otherwise the feedback of Coutn to Outn has the same effect as Coutp and no adjustment of asymmetric MEMS amplitudes would be possible (see also FIG. 17).

If Coutn=Coutp is valid, the ratio of the signals at Outp and Outn determined according to 20'log 10(outP/outN) is fixed and keeps as it is. The amplification A at Outp is A=(1+Coutp/(Cvmic+Coutn)). Since the output Vbot (connected to INN) of the MEMS-device 100 is connected to Vmic a negative feedback to Outn is generated. The signal Outn is attenuated with the same order as the signal Outp was amplified. The voltage attenuation at Outn is A=((1−Coutp/(Cvmic+Coutn)). Several Capacitors (not shown in FIG. 18) with switches 60 between Vmic and/or Outp/Gnd can be implemented to have a wider tuning range. If a signal attenuation at Outp is needed, than the capacitor Coutp is switched to ground and at the same time Coutn is connected with a switch to Outn. The amplification A for signal Outn is A=(1+Coutn/(Cvmic+Coutp)). The attenuation of the signal Voutp is A=(1−Coutn/(Cvmic+Coutp)). The attenuation is an amplification smaller than 1, therefore amplification and attenuation are abbreviated by letter A.

Figure 17:
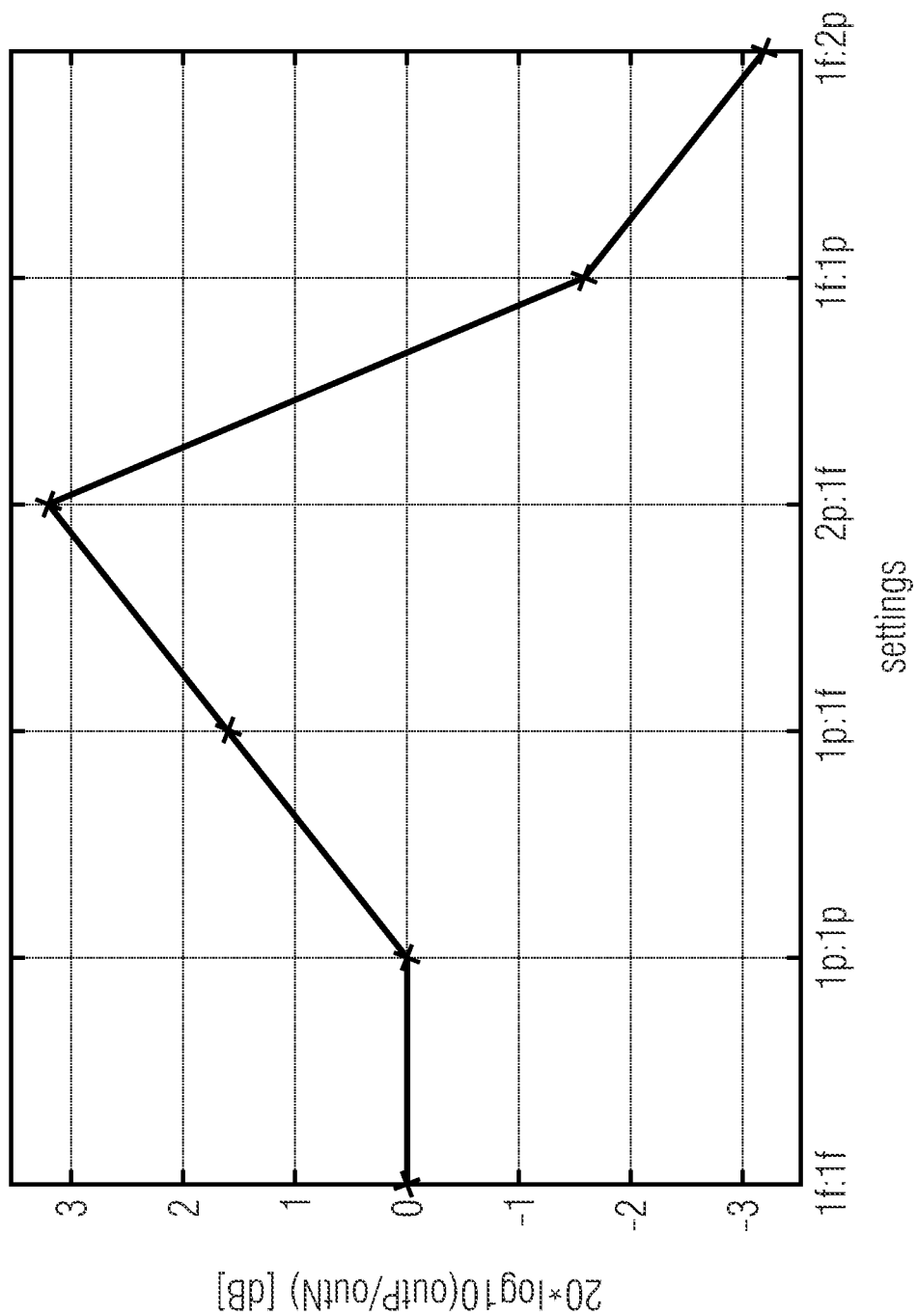
FIG. 17 shows simulation result for a feedback signal generated from a circuit according to FIG. 16.

FIG. 17 shows the ratio of the output signals 70 determined according to 20*log 10(OutP/OutN) for capacitances Coutp, Coutn having different values and Cvmi=10 pF (compare with FIGS. 14a, 14b). FIG. 18 shows a principle circuit, if capacitors Coutp, Coutn are connected between outn to Vmic and outp to Vmic. If the same values for Coutp and Coutn are chosen, i.e. for example Coutn=Coutp=1 fF, the ratio of outp/outn is 1 or 0 as shown in FIG. 17, if the functions is logarithmic according to 20*log 10(outp/outn). The first and the 2nd values at 1 f:1 f (=Coutn=Coutp=1 fF) and 1 p:1 p (=Coutn=Coutp=1 pF) of FIG. 17 shows this. However, because the ratio of OutP7OutN is shown in a logarithmic scale, the first and the 2nd values at 1 f:1 f and 1 p:1 p are at zero, according to log 10(1)=0.

If Coutp is bigger than Coutn than the signal at outp gets larger whereas the signal at outn gets smaller. This is shown for settings at 1 p:1 f (for CoutP=1 pF and Coutn=1 fF) and 2 p:1 f (for CoutP=2 pF and Coutn=1 fF). The settings at 1 f:1 p (for CoutP=1 fF and Coutn=1 pF) and 1 f:2 p (for CoutP=1 fF and Coutn=2 pF) show the effect when Coutn is larger than Coutp. In particular, the capacitances Coutp and Coutn are different, preferably one is Zero whereas the other value is chosen to get the preferred amplitude change. For the final version of the ASIC the capacitors are connected with switches 60 either to Gnd or to outn (Coutn) or outp (Coutp)(see FIG. 18).

In order to compensate a difference in the amplitudes of the signals 50 a voltage node (Vmic) and capacitances Coutn, Coutp, that may be connected to the second outputs OutN, OutP may be provided, in particular the voltage node (Vmic) and the capacitances Coutn, Coutp are provided at an ASIC. By connecting the first outputs outP1, outN1 or the second outputs outP, outN of the first and second transistor circuits 32, 34 to the voltage node Vmic of the MEMS-device 100 for generating a feedback lined back to the MEMS-readout circuit 10, a difference between amplitudes of signals at the first contact pins INP, INN of the first and second capacitances C1, C2 is compensated by switching capacitances Coutn, Coutp accordingly. The Coutn, Coutp are provided in a path between the second outputs outP, outN and the voltage node Vmic.

Both outputs, the first outputs outP1, outN1 or the second outputs outP, outN, are needed for compensation (as shown in FIGS. 16 and 18), since a capacitance from outp/outp1 to Vmic can only increase the ratio outP/outN or outp1/outn1 respectively, whereas a capacitance from outn or outn1 to Vmic decreases the ratio outp/outn or outp1/outn1 respectively. If the MEMS delivers a symmetric signal no or the same capacitances between Vmic and outp1/outp, Vmic and outn1/outn will be connected. There would be one case that only one capacitances needs to be changed. If a fixed capacitance Cfix is connected between Vmic and e.g. outn/outn1, then only the capacitance at Vmic and outp/outn1 needs to be changed. The switchable capacitance needs to be either larger than Cfix or lower than Cfix to change the ratio of the MEMS input amplitudes to values larger and smaller than 1.

With respect to FIG. 18, the following settings Aa and Bb are preferred. According to a setting Aa, the capacitance Coutp is connected to the second output OutP, and the capacitance Coutn is connected to ground Gnd. Thus, the corresponding switches 60 in FIG. 18 should be closed. However, in FIG. 18 all switches 60 are shown on an opened state for simplicity. With setting Aa the signal at Outp is amplified with the factor A=1+Coutp/(Cvmic+Coutn), whereas the signal at outn is attenuated according to A=1−Coutp/(Cvmic+Coutn).

The setting Aa may be used, if the MEMS-device 100 deliver lager signals at Inn compared to the signal at Inp.

According to a setting Bb, the capacitance Coutn is connected to the second output Outn, and the capacitance Coutp is connected to ground gnd. Thus, the corresponding switches 60 in FIG. 18 should be closed. With setting Bb the signal at Outn is amplified with the factor A=1+Coutn/(Cvmic+Coutp), whereas the signal at outn is attenuated according to A=1−Coutn/(Cvmic+Coutp).

The setting Bb may be used, if the MEMS-device 100 deliver lager signals at Inp compared to the signal at Inn. To have a higher trimming range several capacitances (not shown in FIG. 18) may be implemented, such that the capacitances may be connectable via switches 60 to the second output Outp and the Vmic-node and/or may be connectable via switches 60 to the second output Outn and the Vmic-node and/or to ground Gnd.

With the MEMS-readout circuit 10 described herein it is favorable that the differential output (OutP−OutN) is close to zero. When choosing the capacitance CoutN and CoutP such that the one is twice as great as the other, the simulation results show a maximum, for example at 2 p:1 f, and a minimum, for example at 1 f:2 p, of the output signal (outP−OutN). For the implementation of the readout circuit 10 and the circuits of FIG. 16 and FIG. 18 switches 60 are used. If more signal at outp is needed, than a feedback capacitance is activated with a switch 60. If less signal is needed at outp the corresponding capacitance is connected to Gnd with an additional switch 60. For more signal at outn the same procedure is done.

If the capacitance Coutp is connected to the Vmic node, than the feedback results in an increased signal at the second output outp, in particular according to:

Signal(outp)=Voutp=signal(inp)*$A$*(1+Coutp/ (Cvmic+Coutn)).

The Vmic node keeps its voltage that is why the second output outn has to attenuate the signal, in particular according to:

Signal(outn)=Voutn=signal(inn)*$A$*(1−Coutp/ (Cvmic+Coutn)).

Figure 20:
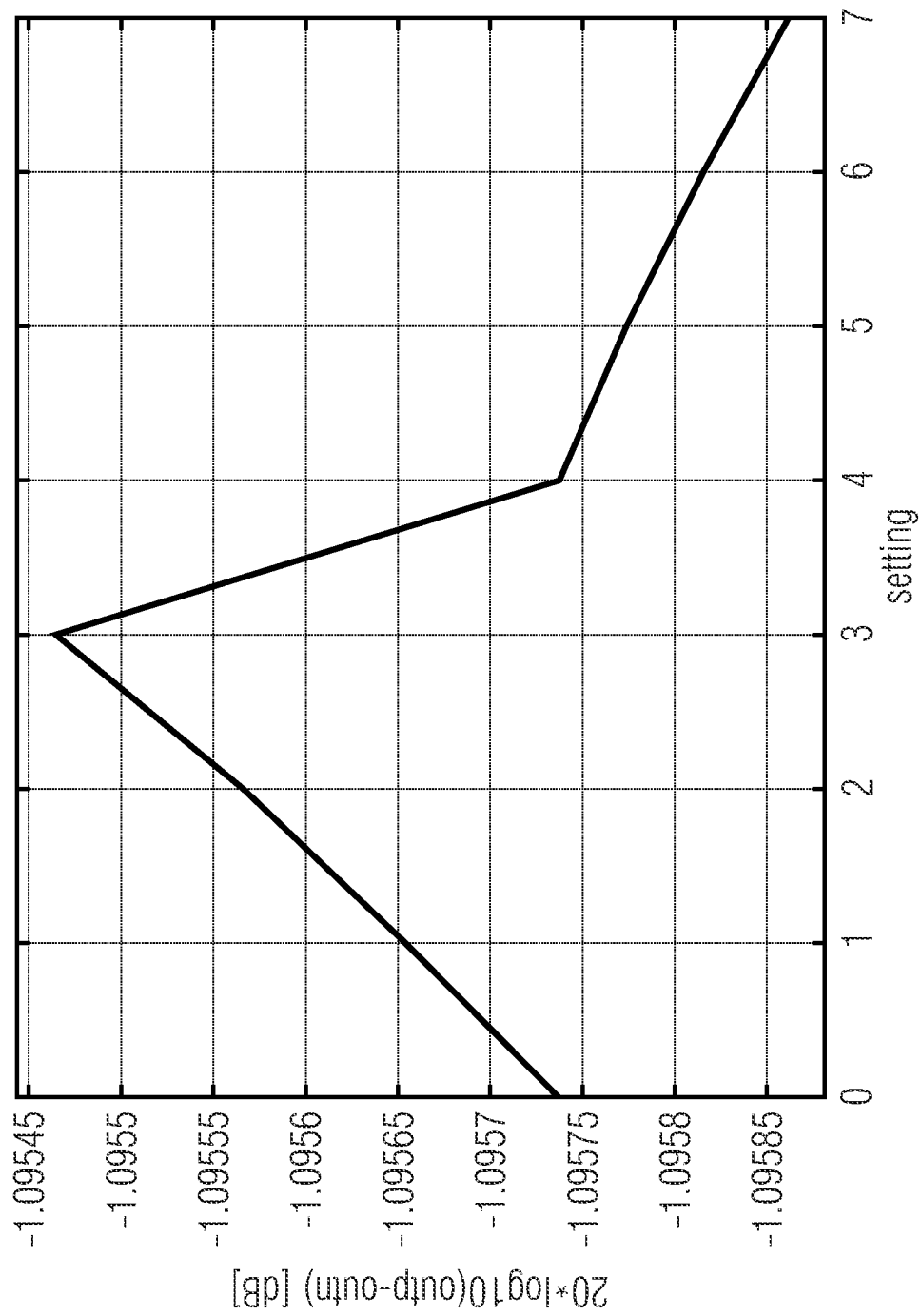
FIG. 20 shows simulation results of the differential output signal with asymmetric input signals.

As shown in the FIG. 20 the differential output stays constant, whereas at the same time the signal at output outp is amplified and the signal at the output outn is attenuated. This can be applied also the other way around (see FIG. 18). If the capacitance Coutn is connected to Vmic, then the voltage at the second output outn is amplified, in particular according to:

(Voutn=inn*$A$*(1+Coutn/(Cvmic+Coutp))

and the voltage at the second output outp is attenuated at the same time, in particular according to:

(Voutp=inp*$A$*(1−Coutn/(Cvmic+Coutp)).

Figure 23:
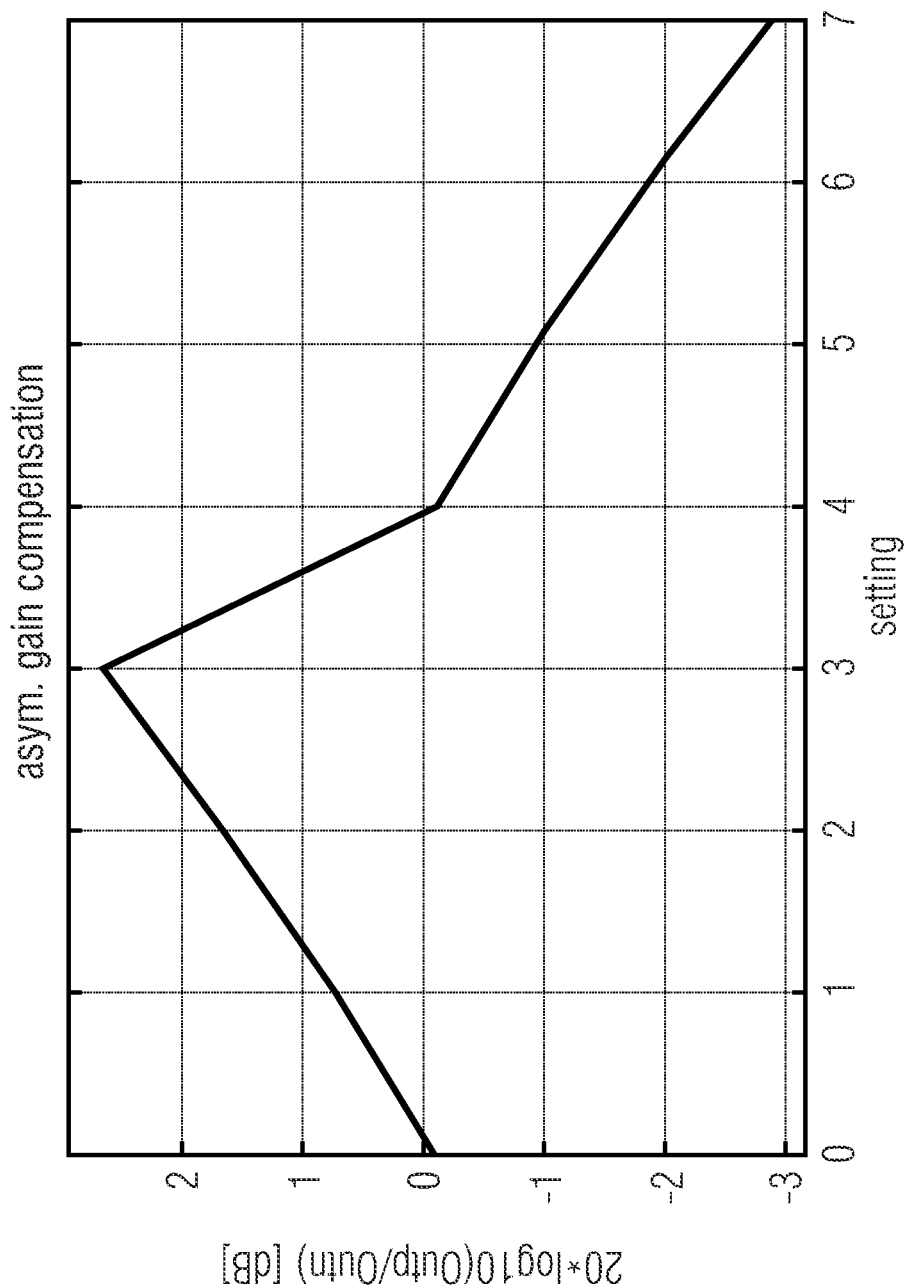
FIG. 23 shows simulation results of the ratio of signals at output outP and outN.

FIGS. 17 and 23 show the compensation range. If the Mems-device 100 provides an amplitude mismatch inp/inn of ~+2.8 dB, then setting 7 (see table 2 and FIG. 23) will be used. The setting 7 gives −2.7 dB, together with the −2.8 dB of the MEMS-device 100 the difference will be 0 dB. With this setting the best THD and highest sound pressure level can be achieved.

FIG. 20 shows simulation results of the differential output signal (outp−outn) with asymmetric input signals. The settings 0 to 7 used to obtain the simulation result presented in FIGS. 20 to 23 is summarized in table 2.

TABLE 2

| setting | Coutp to Vmic | Coutn to Vmic |
| --- | --- | --- |
| 0 | connected to gnd | connected to gnd |
| 1 | 600fF | connected to gnd |
| 2 | 1.2 pF | connected to gnd |
| 3 | 1.8 pF | connected to gnd |
| 4 | connected to gnd | connected to gnd |
| 5 | connected to gnd | 600fF |
| 6 | connected to gnd | 1.2 pF |
| 7 | connected to gnd | 1.8 pF |

As presented in FIG. 20, the signal transfer function (outp−outn) keeps essentially constant. According to FIG. 20 the transfer function moves between −1.09545 dB and −1.09585 dB, i.e. in a range of 0,0004 dB, that is essentially constant. This means, the transfer function (outp−outn) keeps constant, although the single ended outputs were amplified or attenuated, as presented in FIGS. 21 and 22.

Figure 21:
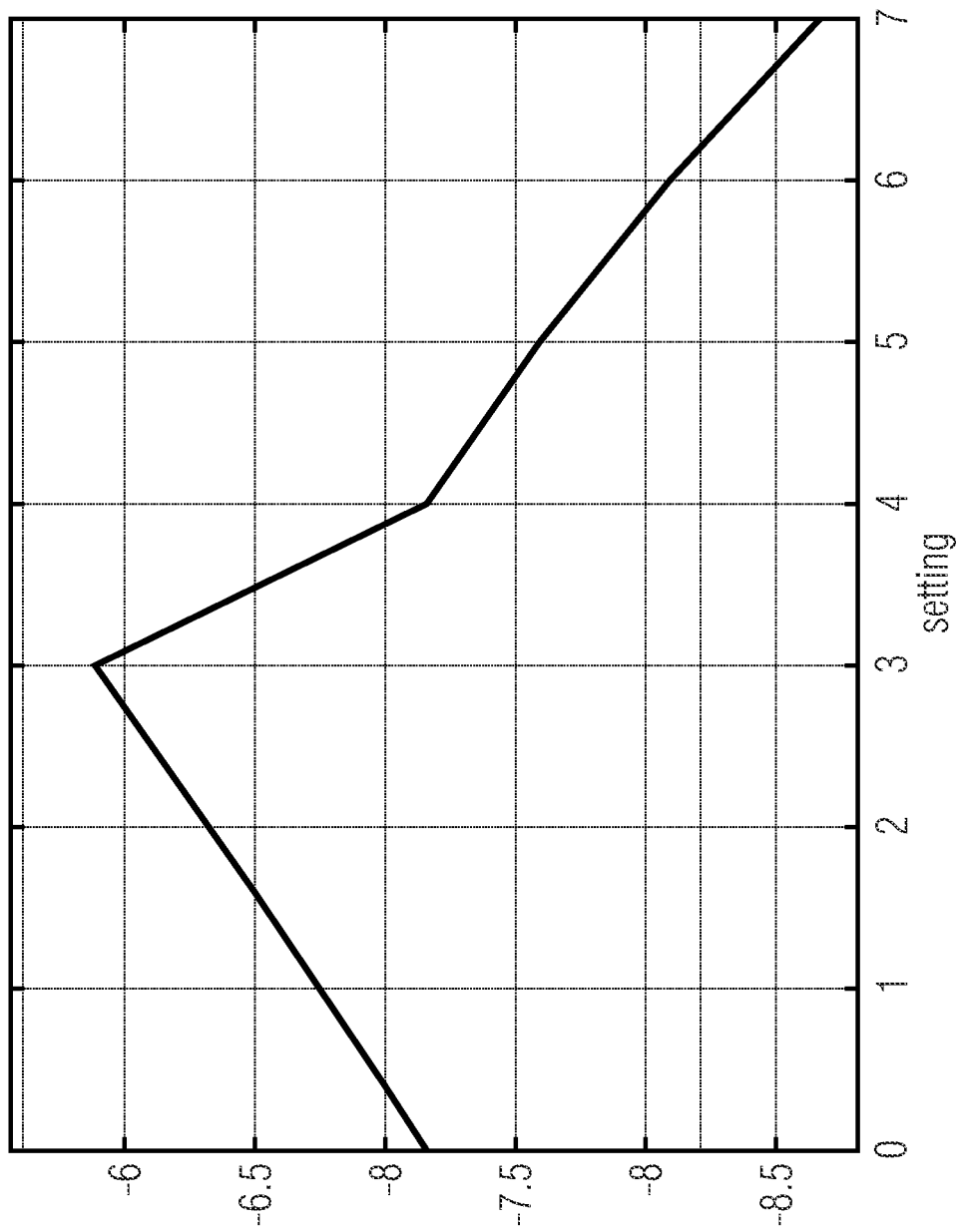
FIG. 21 shows simulation results of the signal at output outP used to determine the results shown in FIG. 20 and in FIG. 23.
Figure 22:
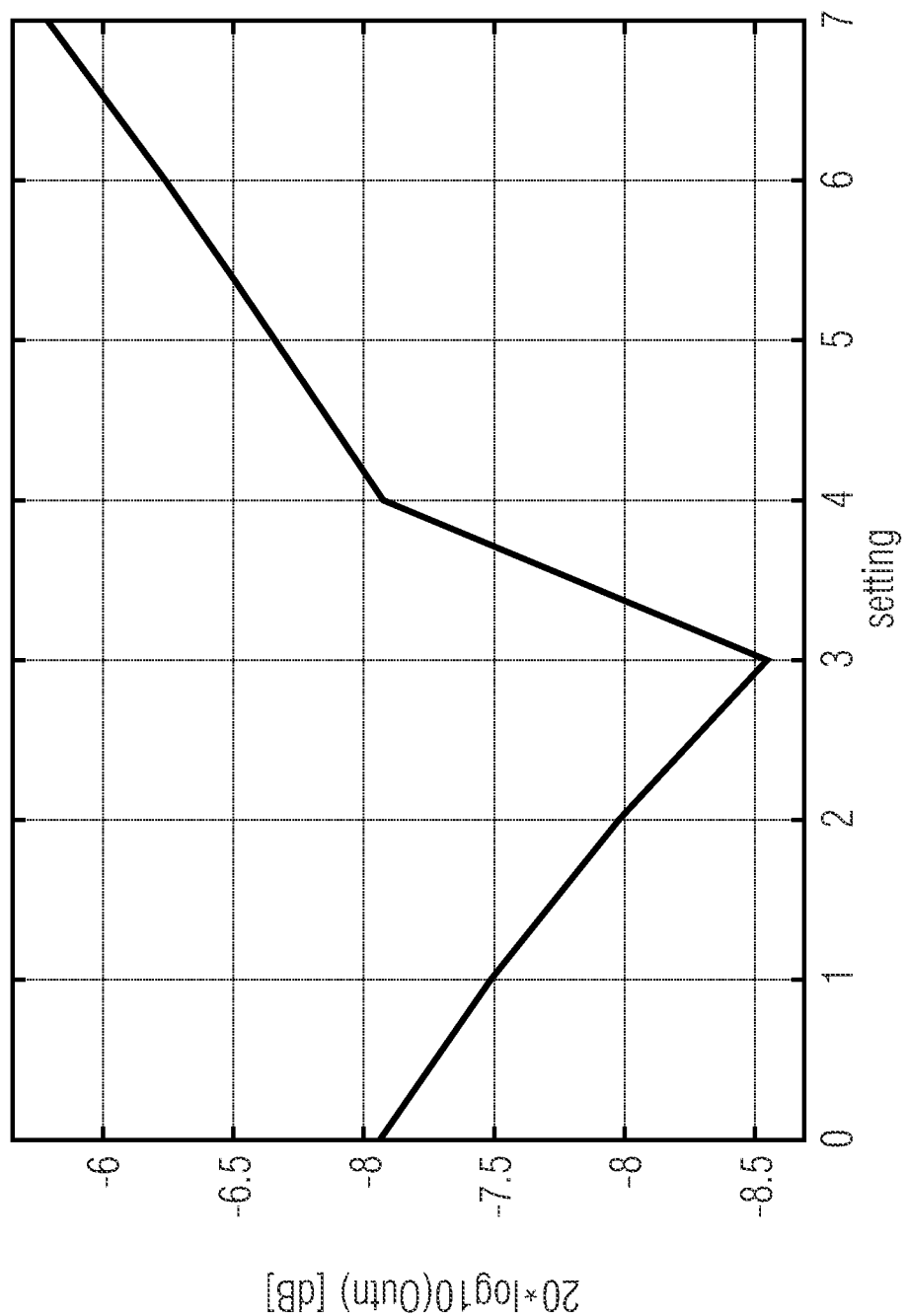
FIG. 22 shows simulation results of the signal at output outN used to determine the results shown in FIG. 20 and in FIG. 23.

FIG. 21 shows simulation results of the signal at output outP used to determine the results shown in FIG. 20 and in FIG. 23. FIG. 22 shows simulation results of the signal at output outN used to determine the results shown in FIG. 20 and in FIG. 23. The settings 0 to 7 used to calculate the values presented in FIGS. 20 to 23 are summarized in table 2. FIG. 23 shows simulation results of the ratio of signals at output outP and outN, i.e. the ratio of the signals as presented in FIGS. 21 and 22.

The voltage node Vmic is derived from the charge pump 95 and a voltage of the voltage node Vmic is used to set a matching sensitivity of the MEMS-device 100.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

Additional embodiments and examples are described which may be used alone or in combination with the features and functionalities described herein.

Example embodiments of the present invention are summarized here. Other embodiments can also be understood from the entirety of the specification and the claims filed herein.

Example 1. A differential MEMS-readout circuit comprising: a first input bonding pad, which represents a first capacitance; wherein the first capacitance comprises the first input bonding pad as a first contact pin and a second contact pin; a second input bonding pad, which represents a second capacitance; wherein the second capacitance comprises the second input bonding pad as a first contact pin and a second contact pin; and a differential-readout amplifier section comprising a first input connected to the first contact pin of the first input bonding pad and a second input connected to the first contact pin of the second bonding pad, wherein the differential-readout amplifier section comprises a first and a second transistor circuit and each of the second contact pins of the first and second input bonding pads is coupled to one of the first and the second transistor circuits or is coupled to one of the first and the second transistor circuits and/or to ground.

Example 2. MEMS-readout circuit according to example 1, wherein each of the first and second transistor circuit comprises a first output and a second output, wherein the second contact pins are impinged with one of the signals from the first output and/or second output and/or ground.

Example 3. MEMS-readout circuit according to example 2, wherein the first output of each of the first and second transistor circuits is an intermediate output of the differential-readout amplifier section, in particular the first output of each of the first and second transistor circuits provides a buffered input signal.

Example 4. MEMS-readout circuit according to example 2, wherein the second output of each of the first and second transistor circuits is an external output of the differential-readout amplifier section, in particular the second output of each of the first and second transistor circuits is amplified in an arbitrary ratio of amplification.

Example 5. MEMS-readout circuit according to example 2 or 4, wherein for coupling of the second output of each of the first and second transistor circuits with one of the second contact pins a negative connection of the corresponding bond pad capacitance is used.

Example 6. MEMS-readout circuit according to one of the examples 1 to 5, wherein a connection of the first inputs, the first outputs and/or the second outputs with the corresponding bonding pad is made by metal wires.

Example 7. MEMS-readout circuit according to one of the examples 1 to 5, wherein a connection of the first outputs and/or the second outputs with the corresponding bonding pad is made by switches.

Example 8. MEMS-readout circuit according to example 7, wherein each input bonding pad is connected to two switches for switching between the first outputs and/or the second outputs and the corresponding bonding pad.

Example 9. MEMS-readout circuit according to example 8, wherein in each switching state one of the two switches associated with one of the input bonding pads is opened while the other is closed.

Example 10. MEMS-readout circuit according to one of the proceeding examples, wherein the MEMS-readout circuit is configured to provide a signal transfer function to reduce a difference between the signals at the second output and at the second output of the readout amplifier section.

Example 11. MEMS-readout circuit according to one of the proceeding examples, MEMS-readout circuit according to one of the proceeding claims, wherein one of the second inputs is a positive input (INP) while the other of the second inputs is a negative input (INN) or wherein one of the second input is a negative input (INN) while the other of the second input is a positive input (INP).

Example 12. MEMS-readout circuit according to one of the proceeding examples, wherein, if the first contact pin of the first capacitance is connected to the positive output of the MEMS-device and the second contact pin of the first capacitance is connected to the first output of the first transistor circuit of the readout amplifier section, the first capacitance acts as it is not present, because the first and second contact pins of the first capacitance are switched in phase.

Example 13. MEMS-readout circuit according to one of the proceeding examples, wherein, if the first contact pin of the first capacitance is connected to the positive output of the MEMS-device and the second contact pin of the first capacitance is connected to the first output of the second transistor circuit of the readout amplifier section or to ground, the first capacitance acts as attenuator of the input signal.

Example 14. MEMS-readout circuit according to one of the proceeding examples, wherein, if the first contact pin of the first capacitance is connected to the positive output of a MEMS-device and the second contact pin of the first capacitance is connected to the first output or to the second output of the first transistor circuit of the readout amplifier section, and if first contact pin of the second capacitance is connected to the negative output of a MEMS-device and the second contact pin of the second capacitance is connected to the first output or to the second output of the first transistor circuit of the readout amplifier section, a difference between amplitudes of signals at the first contact pins of the first and second capacitances is compensated.

Example 15. MEMS-readout circuit according to one of the proceeding examples, wherein, if the first contact pin of the first capacitance is connected to the positive output of a MEMS-device and the second contact pin of the first capacitance is connected to the first output or to the second output of the second transistor circuit of the readout amplifier section, and if first contact pin of the second capacitance is connected to the negative output of a MEMS-device and the second contact pin of the second capacitance is connected to the first output or to the second output of the second transistor circuit of the readout amplifier section, a difference between amplitudes of signals at the first contact pins of the first and second capacitances is compensated.

Example 16. MEMS-readout circuit according to one of the proceeding examples, wherein, if the first outputs or the second outputs of the first and second transistor circuits are connected to a voltage node of the MEMS-device for generating a feedback lined back to the MEMS-readout circuit, a difference between amplitudes of signals at the first contact pins of the first and second capacitances is compensated by switching capacitances being provided in a path between the second outputs and the voltage node accordingly.

Example 17. MEMS-readout circuit according to example 16, wherein the voltage at the voltage node is a bias voltage for the MEMS-device, in particular the bias voltage is generated with a charge pump.

Example 18. MEMS-readout circuit according to one of the proceeding examples, wherein the differential-readout amplifier section comprises a number of resistors that are configured to be switched depending on the received differential signals so that a difference between the received differential signals is reduced.

Example 19. MEMS-readout circuit according to one of the proceeding examples, wherein a gain symmetry of up to 1 to 2 dB is achieved, depending on the capacitance of the input bonding pad.

Example 20. A MEMS-device for connection to a MEMS-readout circuit according to one of the proceeding examples, wherein the MEMS device is configured to act as a differential type sensor to provide at the first contact pins differential signals, wherein the MEMS-readout circuit is configured to receive the differential signals and to reduce a difference in the amplitude of the differential signals at the second outputs.

Example 21. System comprising a MEMS-readout circuit according to one of the Example 1 to 19 and a MEMS-device according to example 20.

Example 22. A method of using a MEMS-readout circuit according to one of the examples 1 to 19, the method comprising: providing a MEMS-device; connecting the MEMS-device with the a MEMS-readout circuit by connecting a first input to the first contact pin of the first input bonding pad and connecting a second input to the first contact pin of the second bonding pad, and coupling each of the second contact pins of the first and second input bonding pads to one of the first and the second transistor circuits or to one of the first and the second transistor circuits and/or to ground.

Examples 23. The method of example 22 comprising:
connecting the first contact pin of the first capacitance to the positive output of the MEMS-device and the second contact pin of the first capacitance to the first output of the first transistor circuit of the readout amplifier section, so that the first capacitance acts as it is not present, because the first and second contact pins of the first capacitance are switched in phase, and connecting the first contact pin of the second capacitance to the negative output of the MEMS-device and the second contact pin of the second capacitance to the first output of the second transistor circuit of the readout amplifier section, so that the second capacitance acts as it is not present, because the first and second contact pins of the second capacitance are switched in phase or
connecting the first contact pin of the first capacitance to the positive output of the MEMS-device and the second contact pin of the first capacitance to the first output of the second transistor circuit of the readout amplifier section or to ground, so that the first capacitance acts as attenuator of the input signal in order to reduce a difference between the differential output signals, and connecting the first contact pin of the second capacitance to the positive output of the MEMS-device and the second contact pin of the second capacitance to the first output of the first transistor circuit of the readout amplifier section or to ground, so that the second capacitance acts as attenuator of the input signal in order to reduce a difference between the differential output signals. or connecting the first contact pin of the first capacitance to the positive output of a MEMS-device and connecting the second contact pin of the first capacitance to the first output or to the second output of the first transistor circuit of the readout amplifier section, and connecting the first contact pin of the second capacitance to the negative output of a MEMS-device and connecting the second contact pin of the second capacitance to the first output or to the second output of the first transistor circuit of the readout amplifier section, a difference between amplitudes of signals at the first contact pins of the first and second capacitances is compensated, or connecting the first contact pin of the first capacitance to the positive output of a MEMS-device and connecting the second contact pin of the first capacitance to the first output or to the second output of the second transistor circuit of the readout amplifier section, and connecting the first contact pin of the second capacitance to the negative output of a MEMS-device and connecting the second contact pin of the second capacitance to the first output or to the second output of the second transistor circuit of the readout amplifier section, a difference between amplitudes of signals at the first contact pins of the first and second capacitances is compensated.

Example 24. The method according to one of the examples 22 or 23, comprising:

applying gain to the second output of the first transistor circuit by using a number of resistors R1, R2, R3, R4, wherein an input signal (inoutP) is converted at the second output into an output signal according to outp=inoutP*(R1+R3)/R1; wherein the input signal (inoutP) is a combined signal from the first output and the first input of the of the first transistor circuit; and/or applying gain to the second output of the second transistor circuit by using the number of resistors R1, R2, R3, R4, wherein an input signal (inoutN) is converted at the second output into an output signal according to outn=inoutN*(R4+R2)/R2, wherein the input signal (inoutN) is a combined signal from the first output and the first input of the second transistor circuit.

Example 25. The method according to one of the examples 22 to 24, comprising:

obtaining a same amount of gain at the second output of the first transistor circuit and at the second output of the second transistor circuit, if R1=R2 and R3=R4 is valid.

Example 26. The method according to one of the examples 22 to 25, comprising:

controlling the gain at the second output of the first transistor circuit and at the second output of the second transistor circuit separately, if R1 is unequal to R2 and/or R3 is unequal to R4.

Example 27. The method according to one of the examples 22 to 26, comprising:

connecting the second outputs of the first and second transistor circuits to a voltage node of the MEMS-device for generating a feedback lined back to the MEMS-readout circuit.

Example 28. The method according to example 27, wherein the voltage node is derived from a charge pump and a voltage of the voltage node is used to set a matching sensitivity of the MEMS-device.

Example 29. The method according to examples 27 or 28, comprising:

connecting the second outputs of the first and second transistor circuits to the voltage node of the MEMS-device for generating a feedback lined back to the MEMS-readout circuit, compensating a difference between amplitudes of signals at the first contact pins of the first and second capacitances by switching capacitances being provided in a path between the second outputs and the voltage node accordingly.

Example 30. The method according to example 29, comprising:

connecting the capacitance to the second output of the first transistor circuit, and connecting the capacitance to ground; or connecting the capacitance to the second output of the second transistor circuit, and connecting the capacitance to ground.

Depending on certain implementation requirements, embodiments of the processing device can be implemented in hardware or in software or at least partially in hardware or at least partially in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable. Some embodiments comprise a data carrier having electronically readable control signals, which are capable of cooperating with a programmable computer system, such that one of the methods described herein is performed.

Generally, embodiments of the processing device can be implemented as a computer program product with a program code, the program code being operative for performing one of the methods when the computer program product runs on a computer. The program code may for example be stored on a machine readable carrier. Other embodiments comprise the computer program for performing one of the methods described herein, stored on a machine readable carrier. In other words, an embodiment of the method is, therefore, a computer program having a program code for performing one of the methods described herein, when the computer program runs on a computer.

A further embodiment of the methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory. A further embodiment comprises a processing means, for example a computer, or a programmable logic device, configured to or adapted to perform one of the methods described herein. A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer. The methods described herein may be performed using a hardware apparatus, or using a computer, or using a combination of a hardware apparatus and a computer.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus, the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A differential MEMS-readout circuit comprising:
   a first input bonding pad, which represents a first capacitance; wherein the first capacitance comprises the first input bonding pad as a first contact pin and a second contact pin;
   a second input bonding pad, which represents a second capacitance;
   wherein the second capacitance comprises the second input bonding pad as a first contact pin and a second contact pin; and
   a differential-readout amplifier section comprising a first input connected to the first contact pin of the first input bonding pad and a second input connected to the first contact pin of the second input bonding pad, wherein the differential-readout amplifier section comprises a first and a second transistor circuit and each of the second contact pins of the first and second input bonding pads is coupled to one of the first and the second transistor circuits or is coupled to one of the first and the second transistor circuits and/or to ground,
   wherein the differential-readout amplifier section comprises a number of resistors that are configured to be switched depending on the received differential signals so that a difference between the received differential signals is reduced.

2. The MEMS-readout circuit according to claim 1, wherein each of the first and second transistor circuit comprises a first output and a second output, wherein the second contact pins are impinged with one of the signals from the first output and/or second output and/or ground.

3. The MEMS-readout circuit according to claim 2, wherein the first output of each of the first and second transistor circuits is an intermediate output of the differential-readout amplifier section, and wherein the first output of each of the first and second transistor circuits provides a buffered input signal.

4. The MEMS-readout circuit according to claim 2, wherein the second output of each of the first and second transistor circuits is an external output of the differential-readout amplifier section, and wherein the second output of each of the first and second transistor circuits is amplified in an arbitrary ratio of amplification.

5. The MEMS-readout circuit according to claim 2, wherein for coupling the second output of each of the first and second transistor circuits with one of the second contact pins a negative connection of a corresponding bond pad capacitance is used, wherein the negative connection comprises a cross connection or an out-of-phase connection.

6. The MEMS-readout circuit according to claim 2, wherein a connection of the first inputs, the first outputs and/or the second outputs with the corresponding bonding pad is made by metal wires.

7. The MEMS-readout circuit according to claim 2, wherein a connection of the first outputs and/or the second outputs with the corresponding bonding pad is made by switches.

8. The MEMS-readout circuit according to claim 7, wherein each input bonding pad is connected to two switches for switching between the first outputs and/or the second outputs and the corresponding bonding pad.

9. The MEMS-readout circuit according to claim 8, wherein in each switching state one of the two switches associated with one of the input bonding pads is opened while the other is closed.

10. The MEMS-readout circuit according to claim 2, wherein the MEMS-readout circuit is configured to provide a signal transfer function to reduce a difference between the signals at the second output and at the second output of the readout amplifier section.

11. The MEMS-readout circuit according to claim 2, wherein one of the second inputs is a positive input while the other of the second inputs is a negative input or wherein one of the second inputs is a negative input while the other of the second inputs is a positive input.

12. The MEMS-readout circuit according to claim 2, wherein, if the first contact pin of the first capacitance is connected to a positive output of a MEMS-device and the second contact pin of the first capacitance is connected to the first output or to the second output of the first transistor circuit of the readout amplifier section, the first capacitance acts as it is not present, because the first and second contact pins of the first capacitance are switched in phase.

13. The MEMS-readout circuit according to claim 2, wherein, if the first contact pin of the first capacitance is connected to a positive output of a MEMS-device and the second contact pin of the first capacitance is connected to the first output or to the second output of the second transistor circuit of the readout amplifier section or to ground, the first capacitance acts as an attenuator of the input signal.

14. The MEMS-readout circuit according to claim 2, wherein, if the first contact pin of the first capacitance is connected to a positive output of a MEMS-device and the second contact pin of the first capacitance is connected to the first output or to the second output of the first transistor circuit of the readout amplifier section, and if the first contact pin of the second capacitance is connected to a negative output of the MEMS-device and the second contact pin of the second capacitance is connected to the first output or to the second output of the first transistor circuit of the readout amplifier section, a difference between amplitudes of signals at the first contact pins of the first and second capacitances is compensated.

15. The MEMS-readout circuit according to claim 2, wherein, if the first contact pin of the first capacitance is connected to a positive output of a MEMS-device and the second contact pin of the first capacitance is connected to the first output or to the second output of the second transistor circuit of the readout amplifier section, and if the first contact pin of the second capacitance is connected to a negative output of the MEMS-device and the second contact pin of the second capacitance is connected to the first output or to the second output of the second transistor circuit of the readout amplifier section, a difference between amplitudes of signals at the first contact pins of the first and second capacitances is compensated.

16. A MEMS-device for connection to the MEMS-readout circuit according to claim 2, wherein the MEMS device is configured to act as a differential type sensor to provide at the first contact pins differential signals, wherein the MEMS-readout circuit is configured to receive the differential signals and to reduce a difference in the amplitude of the differential signals at the second outputs.

17. A system comprising a MEMS-readout circuit and a MEMS-device according to claim 16.

18. The MEMS-readout circuit according to claim 1, wherein, if the first outputs or the second outputs of the first and second transistor circuits are connected to a voltage node of a MEMS-device for generating a feedback lined back to the MEMS-readout circuit, a difference between amplitudes of signals at the first contact pins of the first and second capacitances is compensated by switching capacitances being provided in a path between the second outputs and the voltage node accordingly.

19. The MEMS-readout circuit according to claim 18, wherein the voltage at the voltage node is a bias voltage for the MEMS-device, in particular the bias voltage is generated with a charge pump.

20. A method of using the MEMS-readout circuit according to claim 1, the method comprising:
providing a MEMS-device;
connecting the MEMS-device with the MEMS-readout circuit by
connecting a first input to the first contact pin of the first input bonding pad and connecting a second input to the first contact pin of the second input bonding pad, and
coupling each of the second contact pins of the first and second input bonding pads to one of the first and the second transistor circuits or to one of the first and the second transistor circuits and/or to ground.

21. The method of claim 20 comprising:
connecting the first contact pin of the first capacitance to a positive output of the MEMS-device and the second contact pin of the first capacitance to a first output of the first transistor circuit of the readout amplifier section, so that the first capacitance acts as it is not present, because the first and second contact pins of the first capacitance are switched in phase, and
connecting the first contact pin of the second capacitance to a negative output of the MEMS-device and the second contact pin of the second capacitance to a first output of the second transistor circuit of the readout amplifier section, so that the second capacitance acts as it is not present, because the first and second contact pins of the second capacitance are switched in phase or
connecting the first contact pin of the first capacitance to the positive output of the MEMS-device and the second contact pin of the first capacitance to the first output of the second transistor circuit of the readout amplifier section or to ground, so that the first capacitance acts as an attenuator of an input signal in order to reduce a difference between differential output signals of the readout amplifier section, and
connecting the first contact pin of the second capacitance to the positive output of the MEMS-device and the second contact pin of the second capacitance to the first output of the first transistor circuit of the readout amplifier section or to ground, so that the second capacitance acts as an attenuator of an input signal in order to reduce a difference between the differential output signals of the readout amplifier section, or
connecting the first contact pin of the first capacitance to the positive output of the MEMS-device and connecting the second contact pin of the first capacitance to the first output or to a second output of the first transistor circuit of the readout amplifier section, and connecting the first contact pin of the second capacitance to the negative output of the MEMS-device and connecting the second contact pin of the second capacitance to the first output or to the second output of the first transistor circuit of the readout amplifier section, a difference between amplitudes of signals at the first contact pins of the first and second capacitances is compensated, or
connecting the first contact pin of the first capacitance to the positive output of the MEMS-device and connecting the second contact pin of the first capacitance to the first output or to a second output of the second transistor circuit of the readout amplifier section, and connecting the first contact pin of the second capacitance to a negative output of the MEMS-device and connecting the second contact pin of the second capacitance to the first output or to the second output of the second transistor circuit of the readout amplifier section, a difference between amplitudes of signals at the first contact pins of the first and second capacitances is compensated.

22. The method according to claim 20, comprising:
applying gain to a second output of the first transistor circuit by using a number of resistors, wherein an input signal is converted at the second output into an output signal according to signal (outp)=signal(input)*R1+R3/R1; wherein the input signal is a combined signal from a first output and the first input of the first transistor circuit; and/or
applying gain to a second output of the second transistor circuit by using the number of resistors, wherein an input signal is converted at the second output into an output signal according to signal(outn)=signal(input)*R4+R2/R2, wherein the input signal is a combined signal from a first output and the first input of the second transistor circuit.

23. The method according to claim 22, comprising:
obtaining a same amount of gain at the second output of the first transistor circuit and at the second output of the second transistor circuit, if R1=R2 and R3=R4 is valid.

24. The method according to claim 22, comprising:
controlling the gain at the second output of the first transistor circuit and at the second output of the second transistor circuit separately, if R1 is unequal to R2 and/or R3 is unequal to R4.

25. The method according to claim 22, comprising:
connecting the second outputs of the first and second transistor circuits to a voltage node of the MEMS-device for generating a feedback lined back to the MEMS-readout circuit.

26. The method according to claim 25, wherein the voltage node is derived from a charge pump and a voltage of the voltage node is used to set a matching sensitivity of the MEMS-device.

27. The method according to claim 25, comprising:
connecting the first outputs or the second outputs of the first and second transistor circuits to the voltage node of the MEMS-device for generating a feedback lined back to the MEMS-readout circuit,
compensating a difference between amplitudes of signals at the first contact pins of the first and second capacitances by first and second switching capacitances being provided in a path between the second outputs and the voltage node accordingly.

28. The method according to claim 27, comprising:
connecting the second switching capacitance to the second output of the first transistor circuit, and
connecting the first switching capacitance to ground; or
connecting the first switching capacitance to the second output of the second transistor circuit, and
connecting the second switching capacitance to ground.

* * * * *

UNITED STATES PATENT AND TRADEMARK OFFICE
CERTIFICATE OF CORRECTION

PATENT NO. : 12,452,587 B2
APPLICATION NO. : 17/662332
DATED : October 21, 2025
INVENTOR(S) : Muehlbacher et al.

Page 1 of 1

It is certified that error appears in the above-identified patent and that said Letters Patent is hereby corrected as shown below:

In the Claims

In Column 28, Claim 13, Line 67, delete "of the" and insert -- of an --.

Signed and Sealed this
Sixth Day of January, 2026

John A. Squires
*Director of the United States Patent and Trademark Office*